(12) United States Patent
Takata et al.

(10) Patent No.: US 9,266,324 B2
(45) Date of Patent: Feb. 23, 2016

(54) INKJET APPARATUS AND METHOD FOR MANUFACTURING ORGANIC EL DEVICE

(71) Applicant: PANASONIC CORPORATION, Osaka (JP)

(72) Inventors: Masakazu Takata, Osaka (JP); Hirotaka Nanno, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/390,481

(22) PCT Filed: Jul. 2, 2013

(86) PCT No.: PCT/JP2013/004088
§ 371 (c)(1),
(2) Date: Oct. 3, 2014

(87) PCT Pub. No.: WO2014/006877
PCT Pub. Date: Jan. 9, 2014

(65) Prior Publication Data
US 2015/0118778 A1    Apr. 30, 2015

(30) Foreign Application Priority Data

Jul. 5, 2012   (JP) .................................. 2012-151255

(51) Int. Cl.
*B41J 29/38*     (2006.01)
*B41J 2/045*     (2006.01)
(Continued)

(52) U.S. Cl.
CPC .......... *B41J 2/04588* (2013.01); *B41J 2/04516* (2013.01); *B41J 2/04581* (2013.01); *H01L 51/0005* (2013.01); *H01L 51/56* (2013.01); *B41J 2202/09* (2013.01); *H01L 27/3246* (2013.01)

(58) Field of Classification Search
CPC .............. B41J 2/17; B41J 2/145; B41J 2/161; B41J 2/04581; B41J 2/04588; B41J 2/04596; B41J 2/14233; B41J 2202/09; B41J 2202/10
USPC .................. 347/9, 10, 11, 68; 29/25.35, 890.1
See application file for complete search history.

(56) References Cited

U.S. PATENT DOCUMENTS 5,443,922 A      8/1995  Nishizaki et al.
6,715,852 B2 *   4/2004  Yonekubo ............ B41J 2/04551
                                                          347/10
(Continued)

FOREIGN PATENT DOCUMENTS

JP       02-192947       7/1990
JP       05-163488       6/1993
(Continued)

OTHER PUBLICATIONS

Search report from International Patent Appl. No. PCT/JP2013/004088, mail date is Oct. 15, 2013.

*Primary Examiner* — Anh T. N. Vo
(74) *Attorney, Agent, or Firm* — Greenblum & Bernstein, P.L.C.

(57) ABSTRACT

An inkjet device includes an inkjet head having a pressure applier applying voltage to ink contained in a ink reservoir, by executing a standby drive operation of applying a standby oscillation to the ink and a main drive operation of applying a main oscillation to cause the ink to be discharged from nozzles, such that the start of main drive operation execution is within a period where the displacement in the standby oscillation is oriented toward the interior of the nozzles in order to produce interference between the standby oscillation.

4 Claims, 15 Drawing Sheets

(51) Int. Cl.
*H01L 51/00* (2006.01)
*H01L 51/56* (2006.01)
*H01L 27/32* (2006.01)

(56) References Cited

U.S. PATENT DOCUMENTS

| | | | | |
|---|---|---|---|---|
| 6,905,184 B2* | 6/2005 | Sayama | ............ | B41J 2/04581 347/27 |
| 7,950,761 B2* | 5/2011 | Komatsu | ............ | B41J 2/125 347/11 |
| 8,727,507 B2* | 5/2014 | Fukada | ............ | B41J 2/14274 347/68 |
| 8,801,128 B2* | 8/2014 | Tsukamoto | ............ | B41J 2/04528 347/10 |
| 2013/0277663 A1 | 10/2013 | Nanno et al. | | |
| 2013/0285032 A1 | 10/2013 | Nanno et al. | | |
| 2013/0292662 A1 | 11/2013 | Hashimoto et al. | | |
| 2013/0292667 A1 | 11/2013 | Nanno et al. | | |

FOREIGN PATENT DOCUMENTS

| | | |
|---|---|---|
| JP | 2005-205317 | 8/2005 |
| JP | 2009-234134 | 10/2009 |
| JP | 2009-285599 | 12/2009 |
| JP | 2013-45821 | 3/2013 |

* cited by examiner

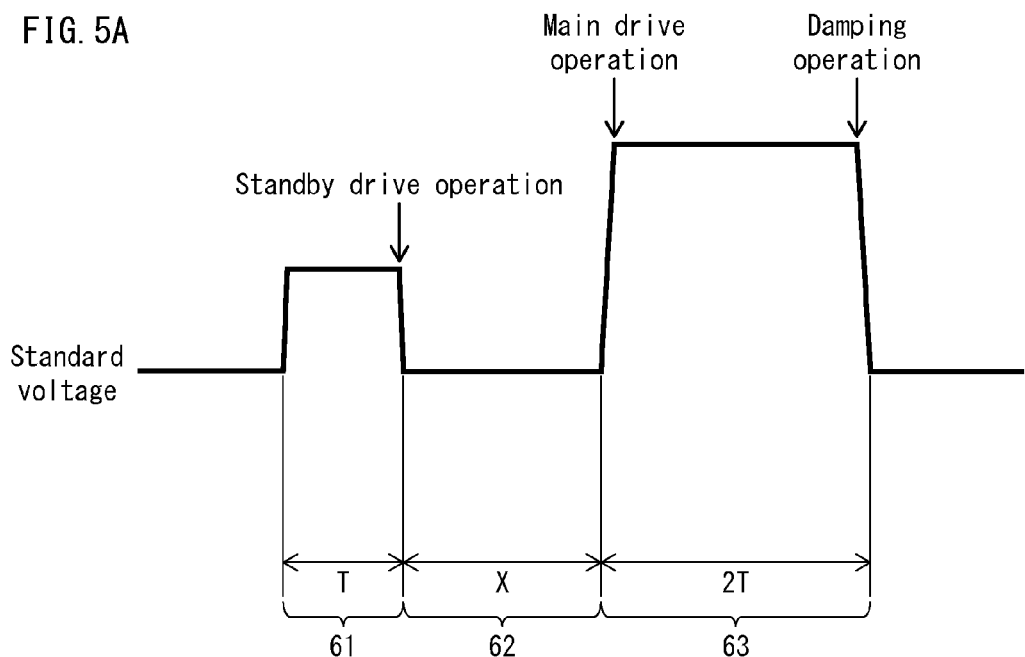
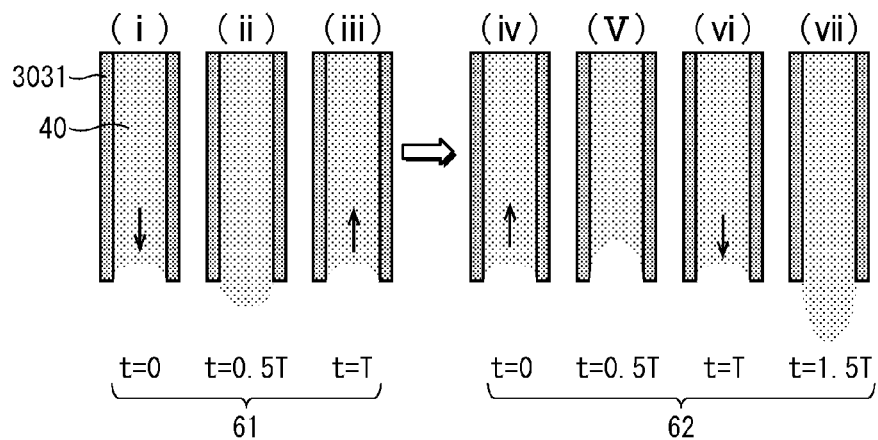
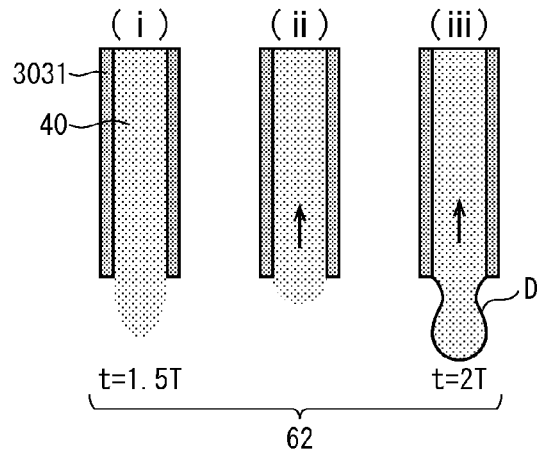

INKJET APPARATUS AND METHOD FOR MANUFACTURING ORGANIC EL DEVICE

TECHNICAL FIELD

The present disclosure pertains to an inkjet device and to an organic electroluminescence device using the inkjet device.

BACKGROUND ART

Many drive schemes for causing ink discharge have been proposed for inkjet devices, including a pump scheme, a piezoelectric scheme, a thermal scheme, and so on. For example, in the piezoelectric scheme, a drive signal (i.e., a drive voltage signal) is applied to voltage elements in order to cause ink discharge by causing an ink reservoir to expand and contract, which applies pressure to the ink within the ink reservoir and causes ink drops to be discharged from nozzles.

In recent years, application technology used in inkjet device is expected to be adapted to device manufacturing, such as for organic electroluminescence devices. Improvements to the landing accuracy of ink drops are thus demanded for increasing device precision.

An impediment to landing accuracy improvements is the problem of satellite mist. This is due to the fact that when ink drops are discharged and fly forward, the rear of the ink drops extends into a ligament, which becomes overextended and is dispersed into micro-droplets that land in locations other than a set landing position.

Increasing the magnitude of the pressure applied to cause the discharge of ink drops tends to extend the length of the ligaments for the ink drops. Ink drops with longer ligaments are more prone to producing satellite mist upon to dispersion of the overextended ligament. Thus, a method for constraining the magnitude drive voltage signal used to cause the discharge of ink drops as much as possible has been considered (Patent Literature 1).

CITATION LIST

Patent Literature

[Patent Literature 1]
Japanese Unexamined Patent Application Publication No. 2005-205317

SUMMARY OF INVENTION

Technical Problem

However, the application of pressure to cause the ink drops to discharge must be performed within a certain magnitude range in order to adjust the discharge speed and the like at which the ink drop ligament detaches from the nozzle or from the ink interface within the nozzle.

There is thus some difficulty in reducing the magnitude of the pressure applied to cause the ink drop discharge for the goal of reducing ligament length in the ink drops.

In consideration of these conditions, a new method of reducing the ligament length in the ink drops is sought, without seeking to decrease the pressure applied to cause ink drop discharge.

In consideration of the above-described problem, the present disclosure seeks to provide an inkjet device and an organic electroluminescence device manufacturing method enabling control of satellite mist occurrence while maintaining a high degree of freedom for setting the pressure applied to cause ink discharge.

SOLUTION TO PROBLEM

In order to achieve the above-stated goal, an inkjet device provides: an inkjet head having an ink reservoir storing an ink, a pressure applier applying pressure to the ink in the ink reservoir, and a nozzle discharging the ink from the ink reservoir as an ink drop; and a discharge controller controlling pressure application by the pressure applier, wherein the pressure applier executes the pressure application to perform: a standby drive operation of applying a standby oscillation to the ink, an amplitude direction matching a discharge direction within a range that does not cause the ink to be discharged from the nozzle; and a main drive operation of applying a main oscillation to the ink, the amplitude direction matching the discharge direction within a range that causes the ink to be discharged from the nozzle, and the main drive operation being performed after the standby drive operation, and a start time of the main drive operation occurs within a time interval where a displacement by the standby drive operation is oriented toward an interior of the nozzle.

Advantageous Effect of Invention

In one aspect of the disclosure, a standby vibration is imparted by a standby oscillation applied to the ink interface in the nozzle by performing a standby drive operation. Then, the main drive operation execution is set up to begin when the displacement by the standby oscillation is oriented toward the interior of the nozzle, such that the main drive operation occurs as the standby vibration is attenuated but before the displacement reaches zero. Accordingly, interference occurs between the standby vibration from the standby oscillation and the main vibration from the main oscillation at the ink interface in the nozzle.

That is, the main oscillation imparted by the main drive operation is a pushing wave causing displacement toward the exterior of the nozzle, where ink drops discharge occurs, while the standby oscillation is a receding wave.

The main oscillation, which is a pushing wave, is subject to interference from the receding standby oscillation. This enables ligament length to be reduced and constrains the occurrence of satellite mist in the ink drops.

Accordingly, the inkjet device pertaining to an aspect of the disclosure enables reduction of ligament length and constraint of satellite mist occurring in the ink drops while maintaining a high degree of freedom for setting the pressure applied to cause ink discharge.

BRIEF DESCRIPTION OF DRAWINGS

FIG. 5A indicates an example of a waveform for a drive voltage signal applied to the inkjet device pertaining to the Embodiment of the disclosure, and FIGS. 5B and 5C are schematic representations of oscillatory behaviour at an ink interface when the drive voltage signal shown in FIG. 5A is applied.

DESCRIPTION OF EMBODIMENTS

Figure 1:
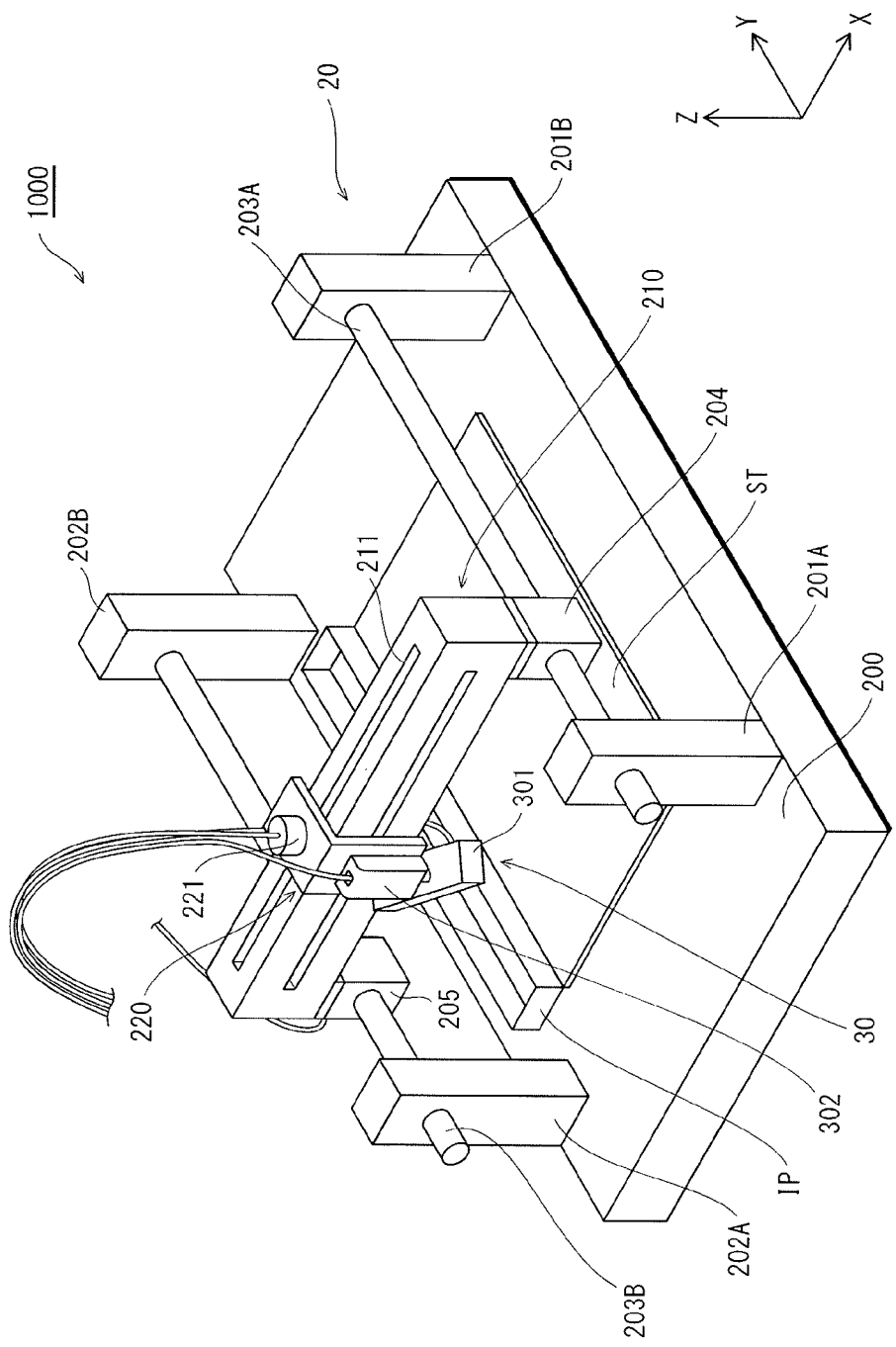
FIG. 1 illustrates the main configuration of an inkjet device pertaining to an Embodiment of the disclosure.

<Background Leading to Invention>
<Satellite Mist>

Using the inkjet device application technology requires improved landing accuracy for the ink drops in order to be effective for manufacturing high-precision devices such as organic electroluminescence devices. However, there is a problem of unsuitable landing associated with satellite mist, which is as an impediment to landing accuracy. Specifically, for an organic electroluminescence device such as a display panel, the occurrence of satellite mist in the manufacturing process causes many minute ink drops to land at positions other than intended, which eventually leads to display failure.

<Conventional Constraints on Satellite Mist>

Thus, the inventors have pursued dedicated investigation into technical means for constraining the occurrence of satellite mist in an inkjet device, especially when using a piezoelectric scheme.

Satellite mist is a multitude of scattered micro-droplets, produced when a column of liquid (also termed the ligament) extending backward from the rear of a round main drop forms and then disperses. The length of the ligament tends to increase with the amplitude of the drive voltage signal, until dispersion. A given amplitude of drive voltage signal produces a given length of ligament.

However, ink viscosity also influences ligament shape, such that the lower the ink viscosity, the more likely the ligament is to disperse while still elongating.

Accordingly, in consideration of ink properties, satellite mist occurrence is constrainable by selecting an ink with higher viscosity. Also, in consideration of drive voltage signal magnitude, satellite mist occurrence is constrainable by setting a smaller magnitude.

<Conventional Technology Problems>

However, forming a film with landing ink drops involves functions set according to the device being manufactured, and requires that ink be selected to have certain properties corresponding to these functions. There is also a need to select ink having properties suited to desired film shape, given that viscosity and the like tends to influence the shape of the film that is formed with the ink. As such, there is in fact a range of selectable ink properties, such that ink adapted to constraining satellite mist occurrence is not freely selectable.

Also, as described above, the magnitude of the drive voltage signal must be set within a fixed range in order to adjust the discharge speed of the ink drops. In terms of discharge speed specifics, given that the discharge speed is lowered when the magnitude of the drive voltage signal is reduced, the discharged drive ink drops are prone to swaying due to stream effects and the like, which leads to new problems of inaccurate landing. Therefore, the actual range of usable drive voltage signal is limited. The drive signal magnitude is not freely selectable for the purpose of constraining satellite mist occurrence.

<Perspectives on New Method for Constraining Satellite Mist>

A new investigation has pursed a different method of constraining satellite mist, rather than using ink properties and drive voltage signal magnitude to do so.

First, the discharge behaviour of the ink drops was observed.

The discharge behaviour of the ink drops is as follows. The main drop, having an initial speed, begins to separate from the ink interface as the ligament grows at a rear end thereof. Then, the speed sufficiently attenuates as the ligament continues to grow. Finally, an average speed serving as the discharge speed is reached and the drop separates from the nozzle or the ink interface inside the nozzle.

The cause of speed attenuation for the main drop is thought to be tensile forces from the ink interface, imparted by air resistance and the ligament. Air resistance is thought to have components connected to speed and to surface area.

(Known and Actualized Technology Background Leading to the Embodiment)

Thus, the inventors first considered the possibility of reducing ligament length in the ink drops with a focus on air resistance.

As a result, the possibility was discovered that although reducing the initial speed of the ink drops does produce a slight decrease in air resistance effect, the greater surface area produces an increase in air resistance that is more influential. This finding suggests an approach of reducing the time required for the ink drop speed to reach the average discharge speed.

In accordance with this observation, the initial speed of the ink drops was reduced while also reducing the time required for the ink drop speed to reach the discharge speed. Then, regarding the ligament on the ink drops, the speed of ligament extension was decreased and the ligament had a shorter extension time.

Also, in consideration of the above, the time required for the speed of the ink drops to reach the average discharge speed is reduced. That is, the time from discharge to splitting of the ligament is reduced.

As such, it was found that constraint is achieved when tensile forces are imparted from the ink interface through the ligament for a shorter time, the ligament itself is shorter and the speed is dramatically attenuated.

That is, it was found that reducing the initial speed of ink drop discharge while keeping the same drive voltage signal magnitude as conventional technology increases the surface of the main ink drop, and enables the tensile forces imparted by the ink interface through the ligament and the average drop force of the main drop to be reduced over average time. It was then found that the time from discharge start to ligament separation is also reduced, and that the attenuation of ink drop speed is constrained.

Based on these findings and determinations, a method of realising the near-term goal of reducing ligament length in the ink drops was used that involves applying a standby oscillation to vibrate the ink interface in advance, before applying the main oscillation to the ink interface that causes the ink drops to be discharged. That is, the application of the main oscillation is applied during an interval where the displacement speed is oriented opposite the discharge speed.

As a result of a later-described validation experiment, the possibility of reducing the ligament length in actual ink drops (see FIGS. 7 and 8) and the possibility of reducing the initial speed while maintaining the same order of speed as the conventional ink drops (see FIGS. 10A and 10B) were confirmed.

[Overview of Aspects]

<Central Configuration of Inkjet Device>

In one aspect, an inkjet device includes: an inkjet head having an ink reservoir storing an ink, a pressure applier applying pressure to the ink in the ink reservoir, and a nozzle discharging the ink from the ink reservoir as an ink drop; and a discharge controller controlling pressure application by the pressure applier, wherein the pressure applier executes the pressure application to perform: a standby drive operation of applying a standby oscillation to the ink, an amplitude direction matching a discharge direction within a range that does not cause the ink to be discharged from the nozzle; and a main drive operation of applying a main oscillation to the ink, the amplitude direction matching the discharge direction within a range that causes the ink to be discharged from the nozzle, and the main drive operation being performed after the standby drive operation, and a start time of the main drive operation occurs within a time interval where a displacement by the standby drive operation is oriented toward an interior of the nozzle.

Here, the interval referred to in the wording "interval where the standby oscillation displacement is oriented toward the interior of the nozzle" includes the start and end points.

This is because of practical difficulties in setting the start and end points to precisely correspond with a standby oscillation of zero. The standby oscillation is more likely to be displaced toward the interior of the nozzle at the start and end points.

As explained above (in the section titled Background of Invention) the inkjet device pertaining to an Embodiment of the disclosure uses a configuration in which interference occurs between the main oscillation and the standby oscillation, produced by applying a standby oscillation that oscillates the ink interface through a standby drive operation applied before the main drive operation applies the main oscillation to the ink interface to cause the discharge of the ink drops.

The main drive operation is set up to start at the point when the displacement speed of the standby oscillation is oriented opposite the discharge speed. This enables the initial speed of the ink drops discharged by performing the main drive operation to be reduced and the surface area of the main drop to be increased. As a result, the ligament length of the ink drops is reduced, which enables the ligament to be reabsorbed into main drop before ligament dispersion.

Applying the above configuration enables the inkjet device of the Embodiment to reduce the ligament length in the ink drops and thus effectively constrains the occurrence of satellite mist, while maintaining a high degree of freedom or setting the pressure applied for ink discharge.

In the present document, the term standby oscillation refers not only to the standby oscillation applied by performing the standby drive operation but also to the oscillation later caused by resonance in order to produce greater amplitude. The term discharge speed refers to the speed of the ink drops discharged from the ink interface at the point of attenuation to reach an average speed, and is distinguished from the initial speed at which the ink drops are discharged from the ink interface. The term average speed does not refer to the strict sense of convergence speed as taken over time from start of fall to infinity, such as in a model of freefall motion used for air resistance considerations, but rather to the reduced speed at the point where the ligament of the ink drop detaches from the nozzle or from the ink interface inside the nozzle, which is relatively lower.

Also, as described above (in the section titled Background of Invention), applying the present configuration enables constraint of excessive attenuation in ink drop speed. As such, the initial speed is reduced while maintaining the same discharge speed as conventional ink drops, despite using the same magnitude of drive voltage signal. In the conventional case, a problem occurs when reducing the magnitude of the drive voltage signal used for ink drops discharge with the goal of reducing ligament length, in that the reduction in initial speed also reduces the discharge speed of the ink drops. That is, conventional technology has a problem in that executing a reduction in initial speed also produces a reduction in discharge speed.

Thus, the present Embodiment has adjusted the parameters of the standby oscillation in terms of the amplitude of the standby oscillation applied by the standby drive operation, the timing at which the main oscillation is applied relative to the orientation of displacement in the standby oscillation, and so on.

Accordingly, the surface area and initial speed of the discharged ink drops is adjusted according to properties of the ink being used, and optimal discharge speed is thus realised.

<Configuration Applying Resonance to Standby Oscillation>

In another aspect, the main drive operation is performed during a resonance state occurring after the standby drive operation and after application of a resonance oscillation causing resonance in the standby oscillation.

The main oscillation is applied to cause the ink drops to be discharged from the ink interface and therefore has a relatively large amplitude. Accordingly, the amplitude of the standby oscillation must also be relatively large in order to produce interference with the main oscillation and effectively decrease the initial speed at which the ink drops are discharged.

Thus, in order to effectively preserve the amplitude of the standby oscillation, the present Embodiment executes the main drive operation after applying the standby oscillation to the ink interface to cause the standby drive operation, and after an additional resonance oscillation (also termed standby resonance oscillation) imparts resonance to the standby drive operation. As a result, the ink drops are discharged at an effectively lower initial speed.

<Pressure Applier Configuration Using Piezoelectric Scheme>

(Main Configuration)

In an additional aspect, the pressure applier includes a piezoelectric element, the discharge controller controls the pressure application by the pressure applier by controlling a voltage signal applied to the piezoelectric element, a waveform of the voltage signal includes a standby oscillatory waveform portion for executing the standby drive operation, and a main oscillatory waveform portion for executing the main drive operation, the main oscillatory waveform portion includes a first period of changing voltage to apply the resonance oscillation, and a second period of changing voltage to apply the main oscillation, and a time interval X between the first period and the second period is set using a time T required for Helmholtz resonance, and satisfies $-0.5T+2nT \leq X \leq 0.5T+2nT$ (where n is a natural number including zero) with a value that is greater than zero.

The piezoelectric scheme involves controlling the amount of change in the voltage elements through the voltage applied to said voltage elements, which enables relatively precise control of the amount and volume of ink discharged. Thus, application is expected in technical fields where high-precision ink drop discharge is required. Nevertheless, the piezoelectric scheme does pose difficulties in terms of ink discharge control, given that the ink reservoir has a microtubule structure. Therefore, unwanted landings due to the satellite mist effect are especially problematic.

Thus, this aspect of the disclosure uses a voltage applier that includes a voltage element, connects a discharge controller that controls the voltage applied to the voltage element to the inkjet head, and controls the ink discharge through the application of a voltage signal to the voltage element. The waveform of the voltage signal is configured to include a standby oscillatory waveform portion for executing the standby drive operation and a main oscillatory waveform portion for executing the main drive operation. Here, the main oscillatory waveform portion includes a first interval in which the voltage is changed to impart a standby resonance oscillation, and a second interval in which the voltage is changed to impart the main oscillation. Specifically, the first interval is where the standby resonance oscillation applies a receding wave reducing the voltage by a fixed amount from the standard voltage value (e.g., zero), and the second interval is where the main oscillation applies a pushing wave increasing the voltage from the reduced value of the first interval.

In addition, the time interval X between the first interval and the second interval of the main oscillatory waveform portion is set using the time T required for causing Helmholtz resonance, with a value that satisfies $-0.5T+2nT \leq X \leq 0.5T+2nT$ (where n is a natural number including zero) and is greater than zero.

In the first interval, the oscillation of the ink interface does resonate due to the application of the standby resonance oscillation. However, in order to produce this resonance, the position of the ink interface at the start of the first interval corresponds to the zero position of a still state. The duration of the first interval is short enough to be ignored, such that the position of the ink interface at the end of the first interval is also equivalent to the zero position. Then, the standby oscillation resonating at the end of the first interval is displaced by the receding wave from zero toward the interior of the nozzle. The standby oscillation serving as the receding wave has these receding wave properties when time t of the end point of the first interval satisfies $0 \leq t \leq 0.5T$, T being the time required to cause Helmholtz resonance. Afterward, pushing wave properties are exhibited during the span $0.5T \leq t \leq 1.5T$, and receding wave properties return during the span $1.5T \leq t \leq 2.5T$. That is, receding wave properties occur when $0 < t$, and in the range $-0.5T+2nT \leq t \leq 0.5T+2nT$ (where n is a natural number including zero).

Accordingly, setting the time interval X between the first interval and the second interval of the main oscillatory waveform portion as described above, with a value that satisfies $-0.5T+2nT \leq X \leq 0.5T+2nT$ (where n is a natural number including zero) and is greater than zero enables the initial speed of the ink drops to be reduced when the main drive operation causes discharge and also enables an increase in surface area for the ink drops. As a result, the ligament length of the ink drops is reduced, which enables the ligament to be reabsorbed into main drop before ligament dispersion.

This aspect is beneficially provided through the following configuration.

The time until the ink interface oscillates in response to the pressure applied by the voltage applier functions as a limit. Also, the standby oscillation, having resonance due to the standby resonance oscillation, tends to attenuate over time. Therefore, in consideration of response time and attenuation of oscillation, setting X to satisfy $1.5T \leq X \leq 2.5T$ is beneficial in terms of effectively reducing the initial speed at which the ink drops are discharged.

Also, the displacement speed toward the interior of the nozzles during the standby oscillation is greatest at a position corresponding to zero displacement. Thus, in consideration of displacement speed, setting X to 2mT (where in is a natural number not including zero) is beneficial in terms of effectively reducing the initial speed at which the ink drops are discharged, and setting X to 2T is further beneficial.

In the present disclosure, a recede-and-return wave is sought as the waveform for the drive voltage signal. Specifically, the standby oscillatory waveform portion is a rectangular pulse that includes an interval where the voltage is reduced by a fixed amount from a standard voltage value (e.g., zero), an interval where the voltage is maintained, and an interval where the standby drive operation is executed to increase the voltage by a fixed amount, the intervals being successively linked in the stated order. Similarly, the main oscillatory waveform portion is a rectangular pulse that includes an interval where the voltage is reduced by a fixed amount from a standard voltage value to apply the standby resonance oscillation, an interval where the voltage is maintained, and an interval where the main drive operation is executed to increase the voltage by a fixed amount, the intervals being successively linked in the stated order.

However, when a push-and-return configuration is used, for example, then the standby oscillatory waveform portion may be a rectangular pulse that includes an interval where the voltage is raised by the fixed amount from the standard voltage value, an interval where the voltage is maintained, and an interval where the standby drive operation is executed to reduce the voltage by the fixed amount, the intervals being successively linked in the stated order. The main oscillatory waveform portion may also be a rectangular pulse that includes an interval where the main drive operation is executed to increase the voltage by the fixed amount from the standard voltage value, an interval where the voltage is maintained, and an interval where the voltage is decreased by the fixed amount, the intervals being successively linked in the stated order. In such a case, the time interval Y between the standby oscillatory waveform portion and the main oscillatory waveform portion is beneficially set as described above, so as to satisfy $0.5T+2nT \leq Y \leq 0.5T+2nT$ (where n is a natural number including zero). The point of difference is only that the standby oscillation is not caused to resonate using the standby resonance oscillation.

(Voltage Change for Standby Drive Operation)

In still another aspect of the disclosure, a voltage change A of the voltage signal when applied to the piezoelectric element causing the standby oscillation of the ink during the standby drive operation is set proportionately to a voltage change B of the voltage signal when applied to the piezoelectric element causing the main oscillation of the ink during the main drive operation, and satisfies $0\% < A/B \leq 20\%$.

In order to effectively produce interference between the main oscillation and the standby oscillation, the proportion A/B between voltage change A applied to the voltage element in the standby drive operation and voltage change B applied to the voltage element in the main drive operation is beneficially controlled. Here, increasing A/B also increases the displacement speed as the amplitude of the standby oscillation grows. Thus, the value of A/B is beneficially as large as possible while remaining within the range at which the ink drops are discharged from the nozzles.

However, in the present disclosure, an upper limit must be set for the value of A/B for standby oscillation considerations, since the standby oscillation produced by applying the standby drive operation is intended to cause resonance as the standby resonance oscillation.

When the ink interface is still, a meniscus forms as the ink pressure on the ink interface and the surface tension on the ink interface are in balance. Then, when pressure is applied to the ink interface, the ink interface oscillates and the restoring force of the meniscus per unit of displacement is thought to operate as a spring constant. Thus, when the magnitude of the applied voltage is increased beyond a given amplitude, the meniscus is less likely to be restored and there is worry that this may be an obstacle to effective resonance.

Thus, the present disclosure sets an upper limit of 20% for the value of A/B. As a result, this enables effective resonance with a standby resonance oscillation to be produced by applying the standby oscillation to the ink interface so as to perform the standby drive operation.

(Initial Speed of Ink Drops)

In yet another aspect, in terms of a discharge speed of the ink being discharged from the nozzle by the main drive operation, an initial speed $V_0$, defined as a speed of the ink passing a tip of the nozzle, and an initial speed $V_0'$, defined as the speed of the ink under conditions identical except that the standby drive operation is not executed, satisfy $50\% \leq V_0/V_0' < 100\%$.

The discharged ink drops begin to separate from the ink interface at a certain initial speed due to the main oscillation being applied. Using the externally-observable nozzle tip as a baseline, and defining the initial speed as the speed at which the drop passes the nozzle tip, then the ink drops at the initial speed undergo speed attenuation due to effects of air resistance and the like, reaching the discharge speed as the ligament extends. There is an optimal range for the discharge speed in terms of achieving beneficial landing accuracy as described above, and constraining the initial speed to this optimal range has the merit of realising effective landing accuracy.

Specifically, slowing down the initial speed at which the ink drops are discharged increases the surface area of the ink drops. The air resistance affecting the ink drops is likely to change in response to the initial speed, with variables including factors related to ink drop speed and to the surface area. Thus, controlling the initial speed enables the discharge speed to be adjusted.

As for the magnitude of reduction applied to the initial speed, there is merit in setting this reduction in consideration of satellite mist conditions that occur when the main drive operation is executed without the standby drive operation, or in other words, in proportion to the initial speed in such a case (also termed a standard initial speed).

Reducing the initial speed in proportion to the standard initial speed promotes reduction in initial speed, which enables the occurrence of satellite mist to be effectively controlled. When the proportion of speed reduction is relatively small, then the effect of air resistance reduction due to the lower ink drop speed and the effect of air resistance increase due to greater surface area are relatively balanced, such that the discharge speed is similar to the standard initial speed. However, excessive speed reduction makes the speed more likely to converge at the overly-reduced discharge speed than at the standard initial speed, which poses difficulties in terms of collection within the optimal range for the discharge speed.

Thus, the present aspect sets initial speed $V_0$ of the ink drops discharged by the inkjet device in relation to initial speed $V_0'$ reached when the main drive operation in similar circumstances without the standby drive operation, to satisfy $50\% \leq V_0/V_0' < 100\%$. The initial speed is reduced when $V_0/V_0' < 100\%$. Also, having $50\% \leq V_0/V_0'$ not only produces the decreased initial speed but also enables the optimal range of discharge speed to be reached without falling below the lower limit of the optimal speed.

The optimal range for the discharge speed depends on the volume of the ink drops when converging on the discharge speed, and normally has a target value of no less than 3 m/s and no more than 6 m/s. Given this goal, then for the given range of values, beneficial values are such that initial speed $V_0'$ is no less than 9 m/s and no more than 18 m/s, meaning that initial speed $V_0$ is then no less than 4.5 m/s and no more than 18 m/s.

<Central Configuration of Manufacturing Method for Organic Electroluminescence Device>

In an alternative aspect, a manufacturing method for an organic electroluminescence device involves: forming a first electrode over a substrate; forming a functional layer that includes a light-emitting layer over the first electrode; and forming a second electrode over the functional layer, wherein at least for the light-emitting layer, the forming of the functional layer involves applying an ink that includes a formation material and a solvent and then drying the ink by causing the solvent to evaporate, and the ink is applied using the inkjet device of the above aspects. The above-described inkjet device of the aspects of the disclosure is used for the aforementioned ink application.

The organic electroluminescence display panel serving as the organic electroluminescence device is configured as an array of organic electroluminescence elements arranged in a matrix over a substrate. The device configuration includes, for example, an anode, a functional layer that includes a light-emitting layer, and a cathode layered in the stated order over the substrate. The functional layer of the inkjet device in turn includes layers such as the light-emitting layer which are formed by using an inkjet method to apply ink that includes an organic material for forming the light-emitting layer into a plurality pixel apertures formed on the substrate and partitioned by a partition wall, and then drying to remove a solvent from the ink.

The formation of the functional layer using the inkjet method requires that the nozzles of the inkjet head discharge ink drops that are contained within the pixel apertures, and that an equal amount of ink be contained in each pixel. However, due to the occurrence of satellite mist, the ink may not be contained in the pixel apertures, or discrepancies in the amount of ink contained may occur as micro-droplets of ink land in positions other than the intended positions within the pixel apertures. This is, in turn, a cause of display malfunctions or of degradation in light properties or useful lifespan when the device is an organic electroluminescence display panel. Thus, a inkjet device that enables constraining the satellite mist effect is strongly recommended for higher landing accuracy and for ensuring an even amount of ink discharge from the nozzles.

The organic electroluminescence device manufacturing method of the disclosure uses the inkjet device pertaining the above-described aspects of the disclosure for the application process involved in forming the functional layer that includes at least the light-emitting layer, namely for applying the ink that includes the material for the layer and drying to remove the solvent in the ink. As a result, this enables constraint of the satellite mist effect and preservation of device properties.

[Embodiment 1]

The following describes an inkjet device pertaining to the present Embodiment, with reference to the accompanying drawings.

<Inkjet Device Configuration>

Figure 2:
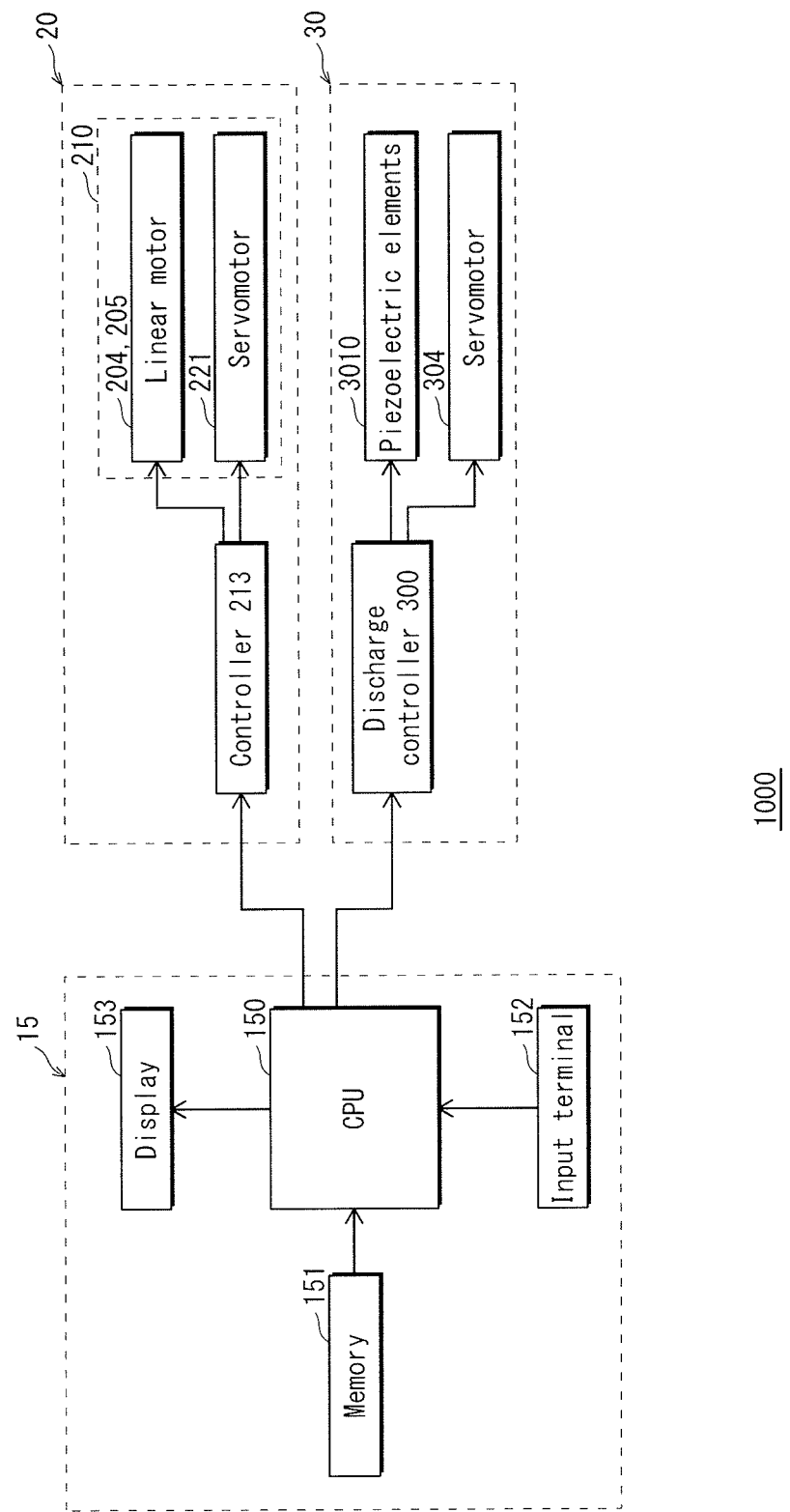
FIG. 2 is a functional block diagram of the inkjet device pertaining to the Embodiment of the disclosure.

FIG. 1 illustrates the main configuration of an inkjet device 1000 pertaining to the Embodiment. FIG. 2 is a functional block diagram of the inkjet device 1000.

As shown in FIGS. 1 and 2, the inkjet device 1000 includes an inkjet table 20, a head 30, and a control device 15.

The inkjet device 1000 is illustrated as having an inkjet head 301 on a single head 30. However, no such limitation is intended. For example, the inkjet head 301 may be provided in plurality by having a plurality of inkjet heads 301 provided a single head 30, or one or more inkjet heads 301 may be provided on each of a plurality of heads 30, or any of various other forms.

As shown in FIG. 2, the control device 15 includes a central processing unit (hereinafter, CPU) 150, a memory 151 (such as a hard disk drive or similar large-capacity memory), a display 153, and an input terminal 152. The control device 15 may specifically be a personal computer (hereinafter, PC). The memory 151 stores a control program or similar for driving the inkjet table 20, and the head 30, which are connected to the control device 15. While driving the inkjet device 1000, the CPU 150 executes instructions input thereto by an operator via the input terminal 152, as well as predetermined control in accordance with the control program stored in the memory 151.

(Inkjet Table)

As shown in FIG. 1, the inkjet table 20 is a work table, specifically a gantry table, on which a gantry portion (i.e., a moving frame) is provided over a base of the table so as to be movable along a pair of guide shafts.

In terms of specific configuration, a plate-like base 200 has columnar stands 201A, 201B, 202A, and 202B provided at four corners of a top face thereof. An inside region surrounded by the stands 201A, 201B, 202A, and 202B has a fixing stage ST and an ink pan IP arranged therein, the fixing stage ST being intended for mounting a substrate that is subject to ink application and the ink pan IP being a plate-like container used in stabilization of discharge properties by causing ink to be discharged immediately prior to application.

Also, guide shafts 203A and 203B are supported in parallel by the stands 201A, 201B, 202A, and 202B, along a longitudinal direction (i.e., a Y-direction) of the base 200. The guide shafts 203A and 203B respectively pass through linear motors 204 and 205. A gantry 210 is mounted so as to overhang the guide shafts 203A and 203B with respect to the linear motors 204 and 205. According to this configuration, the pair of linear motors 204 and 205 is driven during driving of the inkjet device 1000, thus causing the gantry 210 to slide freely up and down the longitudinal direction (i.e., the Y-direction) of the guide shafts 203A and 203B.

The gantry 210 has a carriage 220 provided thereon, the carriage 220 being an L-shaped mount. The carriage 220 is provided with a servomotor (also termed a carriage motor) 221, and a non-diagrammed gear is disposed at a leading end of each motor axis. The gear meshes with a guide groove 211 formed along a longitudinal direction (i.e., the X-direction) of the gantry 210. A set of fine racks is formed within the guide groove 211 along the longitudinal direction. The gear meshes with the rack, such that when the servomotor 221 is driven, the carriage 220 is precisely displaced up and down the X-direction in a rack-and-pinion structure.

Here, the head 30 is equipped on the carriage 220. Thus, the head 30 is able to perform a scanning motion with respect to a substrate subject to application by displacing the gantry 210 along the longitudinal direction of the guide shafts 203A and 203B while the carriage 220 remains fixed with respect to the gantry 210, or by displacing the carriage 220 along the longitudinal direction of the gantry 210 while the gantry 210 remains in place. The main scanning direction of the head 30 is the row (i.e., Y-axis) direction and the sub scanning direction is the column (i.e., X-axis) direction.

The linear motors 204 and 205 and the servomotor 221 are connected to a controller 213 that directly controls the respective driving thereof. The controller 213 is connected to the CPU 150 in the control device 15. During driving of the inkjet device 1000, the CPU 150 reads the control program and in turn controls the respective driving of the linear motors 204 and 205 and of the servomotor 221 via the controller 213.

(Inkjet Head)

The head 30 employs a piezoelectric scheme, and has a configuration that includes a inkjet head 301 and a main body 302. The inkjet head 301 is fixed to the carriage 220 by the main body 302. The main body 302 incorporates a servomotor 304 (see FIG. 2). The servomotor 304 rotates to adjust the relative angle between the longitudinal direction of the inkjet head 301 and the X-axis of the fixing stage ST.

Figure 3A:
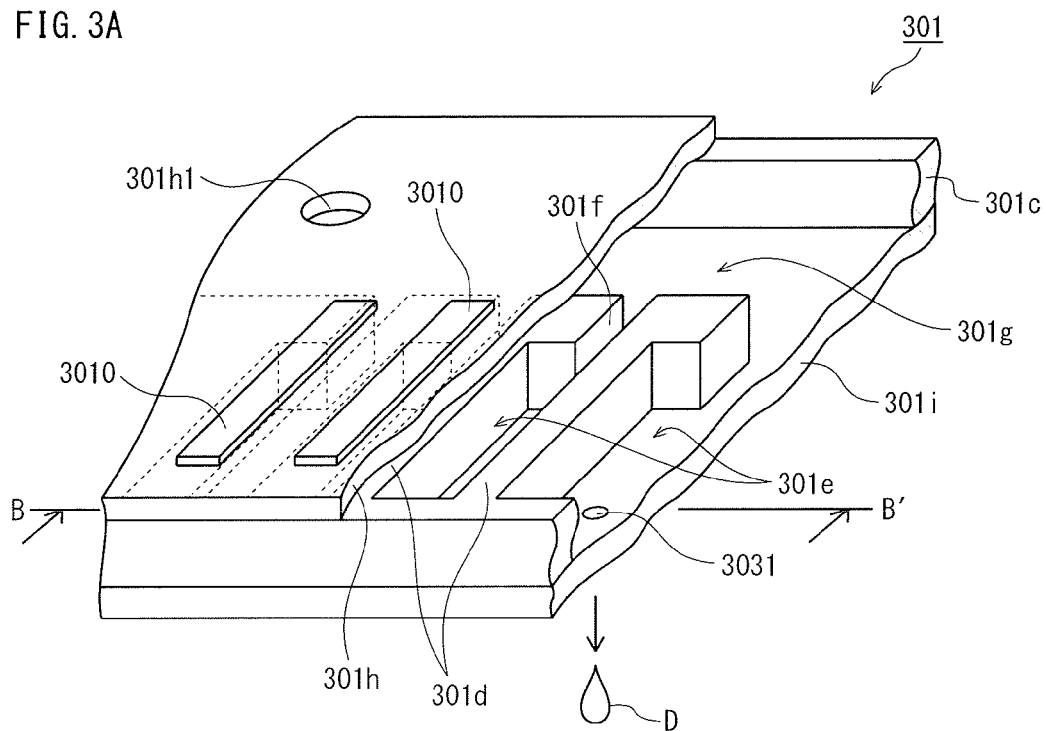
FIGS. 3A and 3B are schematic diagrams showing the overall configuration of an inkjet head for the inkjet device pertaining to the Embodiment of the disclosure, FIG. 3A being a partial cutaway perspective view of inkjet head configuration and FIG. 3B being a magnified cross-sectional view of a portion of the inkjet head.
Figure 3B:
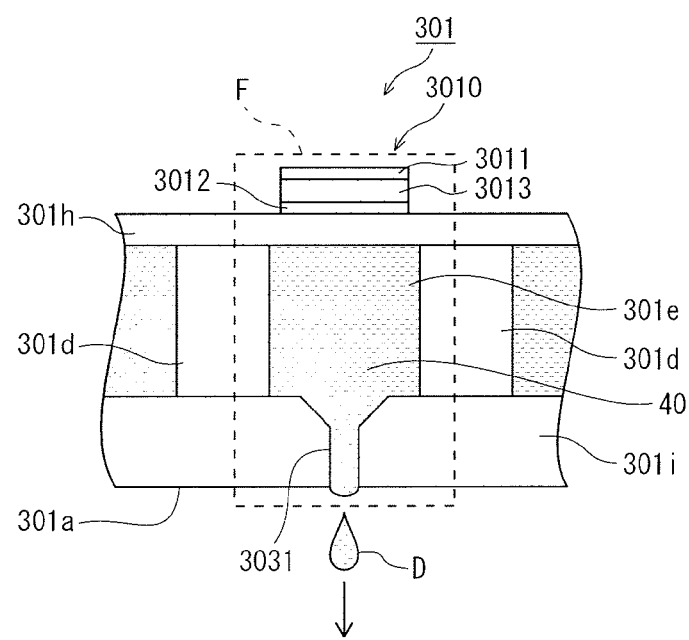

FIG. 3A is a partial cut-away perspective view diagram showing the overall configuration of the inkjet head 301. FIG. 3B is an expanded cross-sectional view of a portion of the inkjet head 301, taken along line B-B' of FIG. 3A. As shown in FIGS. 3A and 3B, the inkjet head 301 has a structure in which a nozzle plate 301$i$, a containment plate 301$c$, and a vibration plate 301$h$ are layered in the stated order. The nozzle plate 301$i$ includes a plurality of nozzles 3031 from which ink drops D are discharged. The containment plate 301$c$ includes partition walls 301*d* partitioning a plurality of ink reservoirs 301*e* that communicate between the nozzles 3031. The vibration plate 301*h* is in contact with each of a plurality of piezoelectric elements, namely pressure appliers 3010 that each correspond to one of the ink reservoirs 301*e* and serve as drivers.

The containment plate 301*c* includes the partition wall 301*d* partitioning the ink reservoirs 301*e* that are in communication with the respective nozzles 3031, as well as flow channels 301*f* and 301*g* for filling the ink reservoirs 301*e* with ink. The flow channels 301*f* and 301*g* are empty spaces surrounded by the containment plate 301*c*, which includes the partition walls 301*d*, and sandwiched between the nozzle plate 301*i* and the vibration plate 301*h*. Here, flow channel 301*g* serves to store a reserve of stored ink.

The ink is supplied through a distribution pipe from an ink tank or the like. Once the reserve has passed through a supply hole 301*h*1 provided in the vibration plate 301*h* and has been stored, the ink reservoirs 301*e* are filled via the flow channel 301*f*.

As shown in FIG. 3B, the piezoelectric elements (also termed the pressure appliers) 3010 are voltage elements in which a piezoelectric element main body 3013 is sandwiched between a pair of electrodes 3011 and 3012. A drive voltage pulse from outside is applied to the pair of electrodes 3011 and 3012 as a drive voltage signal, thus deforming the vibration plate 301*h* joined thereby. According to this configuration, the volume of the ink reservoirs 301*e* partitioned by the partition wall 301*d* is expanded and reduced, the ink 40 filling the ink reservoirs 301*e* has more or less pressure applied thereto, and an ink droplet D is produced in liquid form from each of the nozzles 3031 and then discharged. Then, once the drive voltage pulse application ends, the vibration plate 301*h* returns to a base state. The restoration in volume of the ink reservoirs 301*e* produces suction that pulls the ink from the reserve into the ink reservoirs 301*e*. Controlling the drive voltage signal applied to the piezoelectric elements 3010 enables discharge control to be performed regarding the amount of ink discharged from each of the nozzles 3031, the timing of discharge, and so on.

A region F outlined by dashed lines in FIG. 3B indicates a cross section of the ink reservoir 301*e* and the piezoelectric elements 3010 corresponding to a single one of the nozzles 3031. That is, the region F of the inkjet head 301 includes, as components, one of the ink reservoirs 301*e*, part of the partition walls 301*d*, the vibration plate 301*h*, and the nozzle plate 301*i* making up each of the ink reservoirs 301*e*, as well as one of the piezoelectric elements 3010 and one of the nozzles 3031. In the present Embodiment, the inkjet head 301 includes a plurality of the nozzles 3031. However, no such limitation is intended. For example, a single nozzle 3031 having only the components indicated in the region F may be used as the inkjet head.

The inkjet head 301 has the nozzles 3031 on a face opposite the fixing stage ST. The nozzles 3031 are, for example, disposed in columns along the longitudinal direction of the inkjet head 301. The (liquid) ink suppled to the inkjet head 301 is discharged from the nozzles 3031 toward a substrate subject to application as ink droplets.

The inkjet device 1000 of the present Embodiment is intended for an inkjet head 301 storing one type of ink. However, no such limitation is intended. For example, the head 30 may be provided with a plurality of inkjet heads 301 each corresponding to a different type of ink, and the nozzles 3031 of the respective inkjet heads 301 may discharge the different types of ink toward the substrate subject to application.

As described above, the ink droplet discharge operations of the nozzles 3031 are controlled by a drive voltage signal applied to the piezoelectric elements 3010 of the nozzles 3031. A discharge controller 300 is connected to the inkjet head 301 and causes the nozzles 3031 to discharge ink droplets by controlling the drive voltage signal applied to the piezoelectric elements 3010. Specifically, as shown in FIG. 2, the CPU 150 reads a predetermined control program from the memory 151 and makes an instruction to the discharge controller 300 to apply a defined voltage to the piezoelectric elements 3010, and the discharge controller 300 controls the drive voltage signal applying the piezoelectric elements 3010 accordingly.

In the present Embodiment, the vibration plate 301*h* and the plate-like piezoelectric elements 3010 are layered and flexible vibration elements are used as one face of the ink reservoirs 301*e*. However, no such limitation is intended. For example, vertical vibration elements may be used with rod-like voltage elements, such that the deformation direction of the voltage elements causes deformation of the vibration plate for the ink reservoirs.

(Drive Voltage Signal)
(Waveform Configuration)

The waveform configuration used in the present Embodiment is described with reference to the drawings.

Figure 4A:
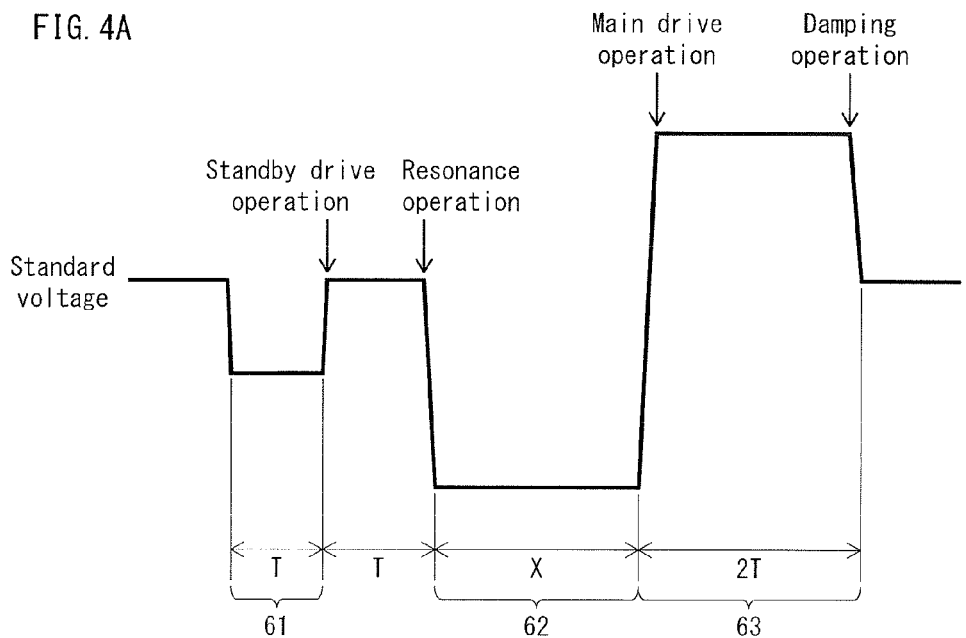
FIG. 4A indicates an example of a waveform for a drive voltage signal applied to the inkjet device pertaining to the Embodiment of the disclosure.
Figure 4B:
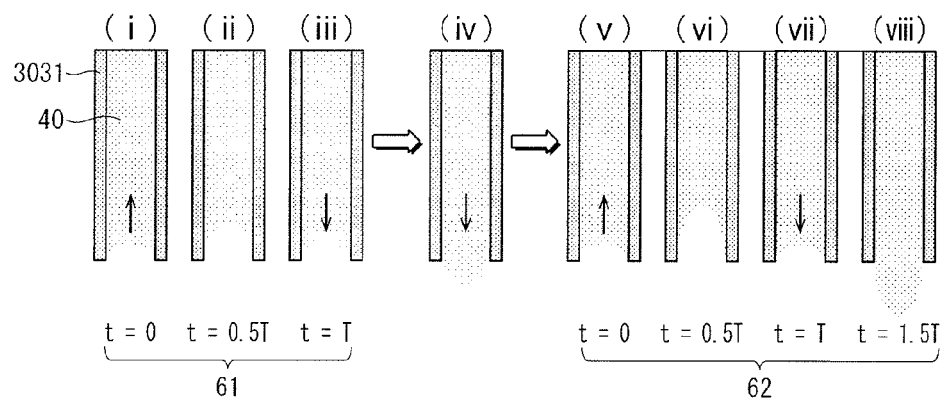
FIGS. 4B and 4C are schematic representations of oscillatory behaviour at an ink interface when the drive voltage signal shown in FIG. 5A is applied.
Figure 4C:
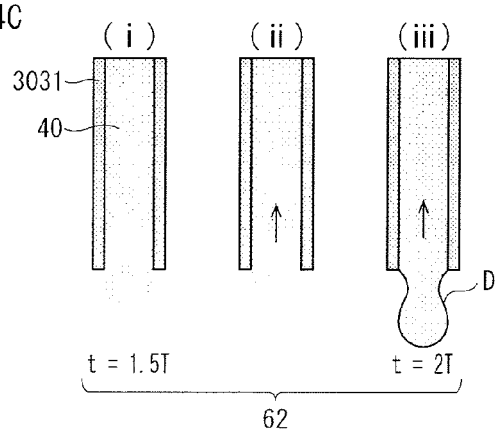

FIG. 4A indicates an example of a waveform configuration for the drive voltage signal applied to the inkjet device pertaining to the present Embodiment. FIGS. 4B and 4C are schematic representations of oscillatory behaviour at the ink interface when the drive voltage signal shown in FIG. 4A is applied. FIG. 5A indicates an example of a waveform configuration for the drive voltage signal applied to the inkjet device pertaining to an Embodiment of the disclosure. FIGS. 5B and 5C are schematic representations of oscillatory behaviour at the ink interface when the drive voltage signal shown in FIG. 5A is applied. FIGS. 4B, 4C, 5B, and 5C are extracted from the vicinity of the nozzles 3031 shown in FIG. 3B.

The waveform of the drive voltage signal shown in FIG. 4A is made up of a standby oscillatory waveform portion 61, a main oscillatory waveform portion 62, and a damping oscillatory waveform portion 63. This is termed a recede-and-return waveform configuration.

The standby oscillatory waveform portion 61 provides an interval in which a standby drive operation is executed, including a period where the volume of the ink reservoir is increased to expand the ink reservoir by reducing the voltage by a fixed amount with respect to the defined standard voltage value, a period where the voltage is maintained, and a period where the volume of the ink reservoir is reduced to contract the ink reservoir by increasing the voltage back to the defined standard voltage value, the standby oscillation being applied within a tolerance such that the ink is not discharged. In order to impart resonance to the standby oscillation at the start time of the standby drive operation, a voltage maintenance interval is set to a time T (hereinafter simply termed time T), which is the time required to cause Helmholtz resonance.

The main oscillatory waveform portion 62 is set at an interval from the standby oscillatory waveform portion 61 equal to time T, and includes a period where resonance is imparted to the standby oscillation to execute a resonance operation by reducing the voltage from the defined standard voltage value by a fixed amount, a period where the voltage value is maintained, and a period where the voltage is increased by a fixed amount to execute the main oscillation, the main oscillation being applied to the ink interface so as to cause the ink to be discharged. The period where the voltage is maintained has a duration of time X. Here, X satisfies −0.5T+2nT≤X≤0.5T+2nT (where n is a natural number including 0) and is greater than zero. In the present Embodiment, X=2T. Setting the time X in this manner enables an execution start time of the main oscillation to be set within a period where the change in standby oscillation, to which resonance has been imparted by the resonance operation, is oriented toward the inside of the nozzles.

The damping oscillatory waveform portion 63 is provided in order to perform a damping operation for damping any remaining oscillation at the ink interface caused by the main oscillation, and includes a period where the voltage is maintained as-is after the end time of the main oscillation execution and a period where the voltage is reduced back to the standard voltage value. The period where the voltage is maintained is set to time 2T in order to cause interference with the main oscillation.

FIG. 4B schematically illustrates the change in oscillatory behaviour over time at the ink interface, caused by the standby oscillatory waveform portion 61 and the main oscillatory waveform portion 62. At time t=0, the oscillatory displacement in the ink interface during the standby oscillatory waveform portion 61 is zero, maintaining a meniscus shape that is essentially still. Then, during the period where the voltage is reduced: (i) retreating pressure is applied to the ink interface as the displacement of the ink interface is oriented toward the interior of the nozzles 3031 (i.e., as indicated by the arrows); (ii) at time t=0.5T, corresponding to a midpoint of the period where the voltage is maintained, the displacement of the ink interface toward the interior of the nozzles 3031 reaches a maximum; and (iii) the displacement is zero at time t=T, when the execution of the standby drive operation begins, and the displacement speed toward the outside of the nozzles 3031 (i.e., as indicated by the arrows) reaches a maximum. The standby drive operation is then executed when the displacement speed reaches a maximum. Thus, the standby oscillation is able to efficiently increase the amplitude by applying resonance to the ink interface oscillation.

Subsequently, during the execution of the standby drive operation: (iv) the displacement of the ink interface toward the exterior of the nozzles 3031 reaches a maximum after the application of the standby oscillation, which is a pushing force displacing the ink interface toward the exterior of the nozzles 3031; and (v) at the starting time of the resonance operation in main oscillatory waveform portion 62 (i.e., at t=0), the displacement is zero and the displacement speed toward the interior of the nozzles 3031 reaches a maximum. The resonance operation is then executed when the displacement speed reaches a maximum. Thus, the standby oscillation is able to efficiently increase the amplitude.

Next, given that the resonating standby oscillation having the resonance operation applied thereto is a pulling force, (vi) the ink interface is displaced toward the interior of the nozzles 3031 as of the end time of the execution period for the resonance operation, i.e., from the start time of the voltage maintenance period (i.e., t=0), and at t=0.5T, the displacement of the ink interface toward the interior of the nozzles 3031 reaches a maximum. Then, at t=T, (vii) the displacement is zero and the displacement speed toward the exterior of the nozzles 3031 (i.e., as indicated by the arrows) reaches a maximum; and (viii) at t=1.5T, the displacement of the ink interface toward the exterior of the nozzles 3031 reaches a maximum. With reference to the oscillatory behaviour of the ink interface, having the interval X during which the voltage is maintained satisfy 0<t≤0.5T indicates that the oscillatory behaviour ink interface takes on a retreating quality.

Furthermore, point (i) in FIG. 4C is equivalent to point (viii) of FIG. 4B, both points corresponding simultaneous oscillatory behaviour of the ink interface. The changes in the oscillatory behaviour of the ink interface over time during the main oscillatory waveform portion 62 beginning at t=1.5T involve (ii) displacement toward the interior of the nozzles 3031 due to the pulling quality; and (iii) at t=2T, the displacement is zero and the displacement speed toward the interior of the nozzles 3031 reaches a maximum. In the present Embodiment, the execution of the main oscillation starts at t=2T, thus applying the main oscillation displaying a pushing quality on the ink interface and causing the ink drops D to be discharged from the nozzles 3031.

When the main oscillation is not executed at the time of point (iii) in FIG. 4C, then the subsequent oscillatory behaviour of the ink interface is affected by attenuation of amplitude. However, identical behaviour occurs as of point (v) in FIG. 4B. Accordingly, when the interval X during which the voltage is maintained until the start of the main oscillation satisfies 1.5T≤X≤2.5 T, generalizable to X satisfying −0.5T+2nT≤X≤0.5T+2nT (where n is a natural number including zero), the oscillatory behaviour of the ink interface at the start time of the main oscillation displays a pulling quality.

Thus, when the interval X for maintaining the voltage is set as such, the standby oscillation displaying the pulling quality and the main oscillation displaying the pushing quality effectively cancel each other out.

The range of 1.5T≤X≤2.5T is beneficial for providing improved acceleration and deceleration relative to the initial speed at which the ink drops are discharged.

With reference to the displacement speed, setting X to 2mT (where in is a natural number not including zero) is beneficial for effective acceleration and deceleration relative to the initial speed at which the ink drops are discharged, and setting X to 2T is further beneficial.

The waveform of the drive voltage signal shown in FIG. 5A is made up of the standby oscillatory waveform portion 61, the main oscillatory waveform portion 62, and the damping oscillatory waveform portion 63. This is termed a push-and-return waveform configuration. The configuration of the damping oscillatory waveform portion is identical to that shown in FIG. 4A.

The standby oscillatory waveform portion 61 provides an interval in which a standby drive operation is executed, including a period where the voltage is increased by a fixed amount with respect to the defined standard voltage value, a period where the voltage is maintained, and a period where the voltage is reduced back to the defined standard voltage value, the standby oscillation being applied to the ink interface within a tolerance such that the ink is not discharged. In order to impart resonance to the standby oscillation at the start time of the standby drive operation, the voltage maintenance interval is set to time T.

The main oscillatory waveform portion 62 includes a period where voltage is maintained at the standard voltage value since the end of the standby oscillatory waveform portion 61, and a period where the voltage is increased by a fixed amount relative to the standard voltage value to execute the main oscillation, the main oscillation being applied to the ink interface so as to cause the ink to be discharged. The period where the voltage is maintained is X, as described for the waveform configuration of FIG. 4A. As such, X is set so as to be greater than zero and to satisfy −0.5T+2nT≤X≤0.5T+2nT (where n is a natural number including zero), specifically X=2T. Setting X in this manner enables the start time of the main oscillation to be set within a period where the change in standby oscillation is oriented toward the inside of the nozzles.

FIG. 5B schematically illustrates the change in oscillatory behaviour over time at the ink interface, caused by the standby oscillatory waveform portion 61 and the main oscillatory waveform portion 62. At time t=0, the oscillatory displacement in the ink interface during the standby oscillatory waveform portion 61 is zero, maintaining a meniscus shape that is essentially still. Then, during the period where the voltage is increased: (i) pushing pressure is applied to the ink interface as the displacement of the ink interface is oriented toward the exterior of the nozzles 3031 (i.e., as indicated by the arrows); (ii) at time t=0.5T, corresponding to a midpoint of the period where the voltage is maintained, the displacement of the ink interface toward the exterior of the nozzles 3031 reaches a maximum; and (iii) the displacement is zero at time t=T, when the execution of the standby drive operation begins, and the displacement speed of the ink interface toward the interior of the nozzles 3031 (i.e., as indicated by the arrows) reaches a maximum. The standby drive operation is then executed when the displacement speed reaches a maximum. Thus, the standby oscillation is able to efficiently increase the amplitude by applying resonance to the ink interface oscillation.

Next, given that the standby oscillation in which the standby drive operation is applied to the ink interface is a pulling force, (iv) the ink interface begins to be displaced toward the interior of the nozzles 3031 as of the end time of the execution period for the standby drive operation, i.e., from the start time of the voltage maintenance period (i.e., t=0). Subsequent change in the oscillatory behaviour over time, namely points (v) through (vii) of FIG. 5B and points (i) through (iii) of FIG. 5C are identical to points (vi) through (viii) of FIG. 4B and points (i) through (iii) of FIG. 4C. Explanations thereof are thus omitted. The waveform configuration of FIGS. 5A-5C differs from the waveform configuration of FIGS. 4A-4C in terms of the absence of the resonance operation. Thus, the amplitude of oscillation of the ink interface is smaller during the interval where the voltage is maintained in the main oscillatory waveform portion 62.

Also, as in the waveform configuration indicated in FIGS. 4A-4C, setting X so as to be greater than zero and satisfy $-0.5T+2nT \leq X \leq 0.5T+2nT$ (where n is a natural number including zero) enables effective interference between the standby oscillation and the main oscillation. Furthermore, with reference to the oscillation response time and the amplitude attenuation at the ink interface due to applied pressure, setting X to satisfy $1.5T \leq X \leq 2.5T$ is beneficial in improving the deceleration relative to the initial speed at which the ink drops are discharged. Also, with reference to the displacement speed, setting X to 2mT (where in is a natural number not including zero) is beneficial for effective deceleration relative to the initial speed at which the ink drops are discharged, and setting X to 2T is further beneficial.

The inkjet device 1000 of the present Embodiment includes a single inkjet head 301, and the inkjet head 301 includes a plurality of the nozzles 3031. Also, the Embodiment is intended for a case where the nozzles 3031 all discharge ink drops of the same type of ink. As such, a drive voltage signal made of the waveform configurations in FIGS. 4A and 5A is applied to all of the nozzles 3031.

However, there is no need to apply the same drive voltage signal to all of the nozzles 3031. For example, although the same type of ink may be used by all of the nozzles, the viscosity thereof may vary due to temperature and the like of the containment environment in the ink reservoir 301e. As such, in consideration of the ligament length for the ink drops discharged from each of the nozzles 3031, the drive voltage signal having the waveform configuration shown in FIGS. 4A and 5A may be applied only to nozzles discharging ink drops prone to forming satellite mist. Meanwhile, a drive voltage signal having a conventional waveform lacking the standby oscillatory waveform portion may be applied to remaining nozzles 3031. Additionally, in consideration of the ligament length for the ink drops discharged from each of the nozzles 3031, the interval X for maintaining the voltage in the main oscillatory waveform portion 62 may be adjusted for each of the nozzles 3031, such that a different drive voltage signal is applied to each of the nozzles 3031, varying in terms of the duration of X.

Also, when the inkjet device 1000 includes a plurality of inkjet heads 301 each containing a different type of ink, then for example, the drive voltage signal made up of the waveform configuration from FIGS. 4A and 5A may be applied to one of the inkjet heads 301 storing ink having a relatively low viscosity, while a drive voltage signal made up of a conventional waveform not including the standby waveform is, for example, applied to the other inkjet heads 301.

(Voltage Change)

Figure 6:
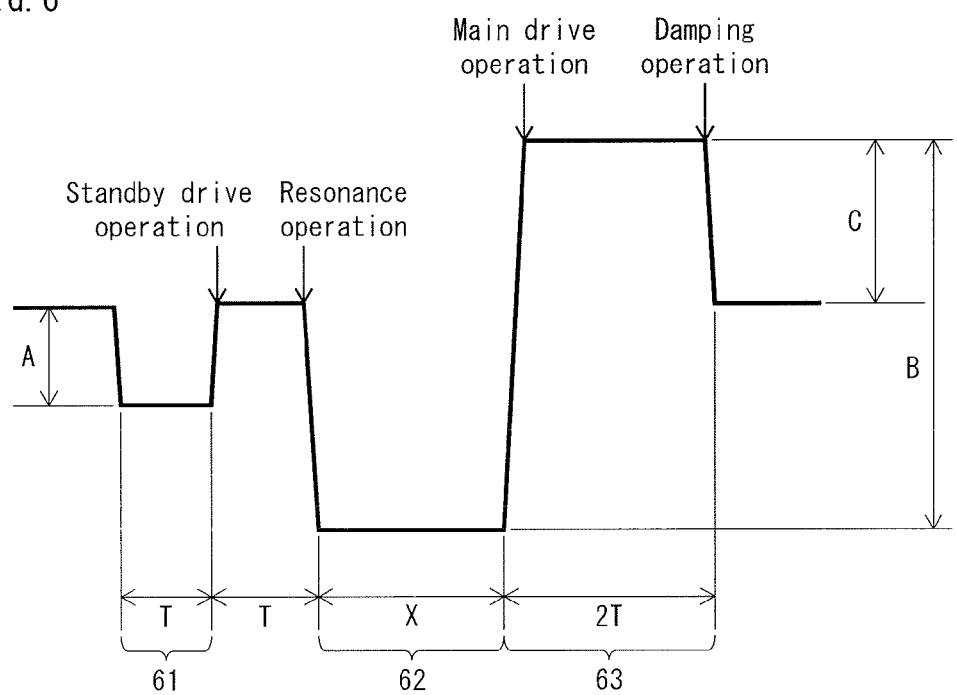
FIG. 6 illustrates a waveform configuration and shape for the drive voltage signal used for the inkjet device pertaining to the Embodiment of the disclosure.

FIG. 6 illustrates the same drive voltage signal pertaining to the present Embodiment as FIG. 4A. Here, voltage change A is applied to perform the standby drive operation, voltage change B is applied to perform the main oscillation, and voltage change C is applied to perform the damping operation. The voltage change applied to perform the resonance operation is the difference between voltage changes B and C.

The following describes the voltage change respectively applied to each of the standby oscillatory waveform portion 61, the main oscillatory waveform portion 62, and the damping oscillatory waveform portion 63.

[Standby Oscillatory Waveform Portion]

The standby oscillatory waveform portion 61 is applied in order to perform the standby drive operation. The magnitude of voltage change A is beneficially set such that ink is not discharged, and so as to cause effective interference with the main oscillation applied in the main oscillation, or so as to be susceptible to resonance by the resonance operation.

With respect to susceptibility to resonance by the resonance operation, voltage change A is beneficially set relative to voltage change B such that $0\% < A/B \leq 20\%$ is satisfied. The proportion A/B being lower than or equal to 20% is beneficial because, as described above, the meniscus shape is difficult to restore once the amplitude of the standby oscillation applied in executing the standby drive operation exceeds a set range. This causes problems in effective resonance.

[Main Oscillatory Waveform Portion]

The main oscillatory waveform portion 62 is applied in order to perform the main drive operation. Here, voltage change B is set in accordance with physical ink properties, so that the ink is discharged in the main oscillation. For example, voltage change B is roughly no less than 10 V and no more than 50 V.

[Damping Oscillatory Waveform Portion]

The damping oscillatory waveform portion 63 is voltage applied with opposite orientation to the main oscillatory waveform portion in order to constrain the amplitude of remaining oscillations in the ink interface along with the main oscillation. An effective range of voltage change C in relation to voltage change B of main oscillatory waveform portion 62 is set such that $30\% \leq C/B$, thereby beneficially constraining the amplitude of remaining oscillations in the ink interface along with the main oscillation. Although not specifically described above, the increase in voltage change is beneficially set such that C/B≤B, in connection with the increased time required to apply a given waveform.

Also, the waveform configuration of the drive voltage signal of the present Embodiment, including the standby oscillatory waveform portion 61, the main oscillatory waveform portion 62, and the damping oscillatory waveform portion 63 as shown in FIG. 6, must satisfy A/B+C/B≤100%. Thus, the upper limit for C/B is defined by the value of voltage change A relative to the base value of A/B.

<Experiments and Inquiry>

(Ligament Length Reduction Effect)

As discussed above, upon dedicated inquiry, the inventors have discovered that applying a standby oscillation to the ink interface prior to applying a main oscillation thereto that causes discharge of ink drops enables the ligament length of the ink drops to be reduced by starting the application of the main oscillation during a period where the displacement due to oscillation is oriented toward the interior of the nozzles. In addition, the inventors concluded that this enables constraint of the satellite mist effect. The following describes experimental results leading to this conclusion, as exemplified in FIGS. 7 and 8.

Figure 7:
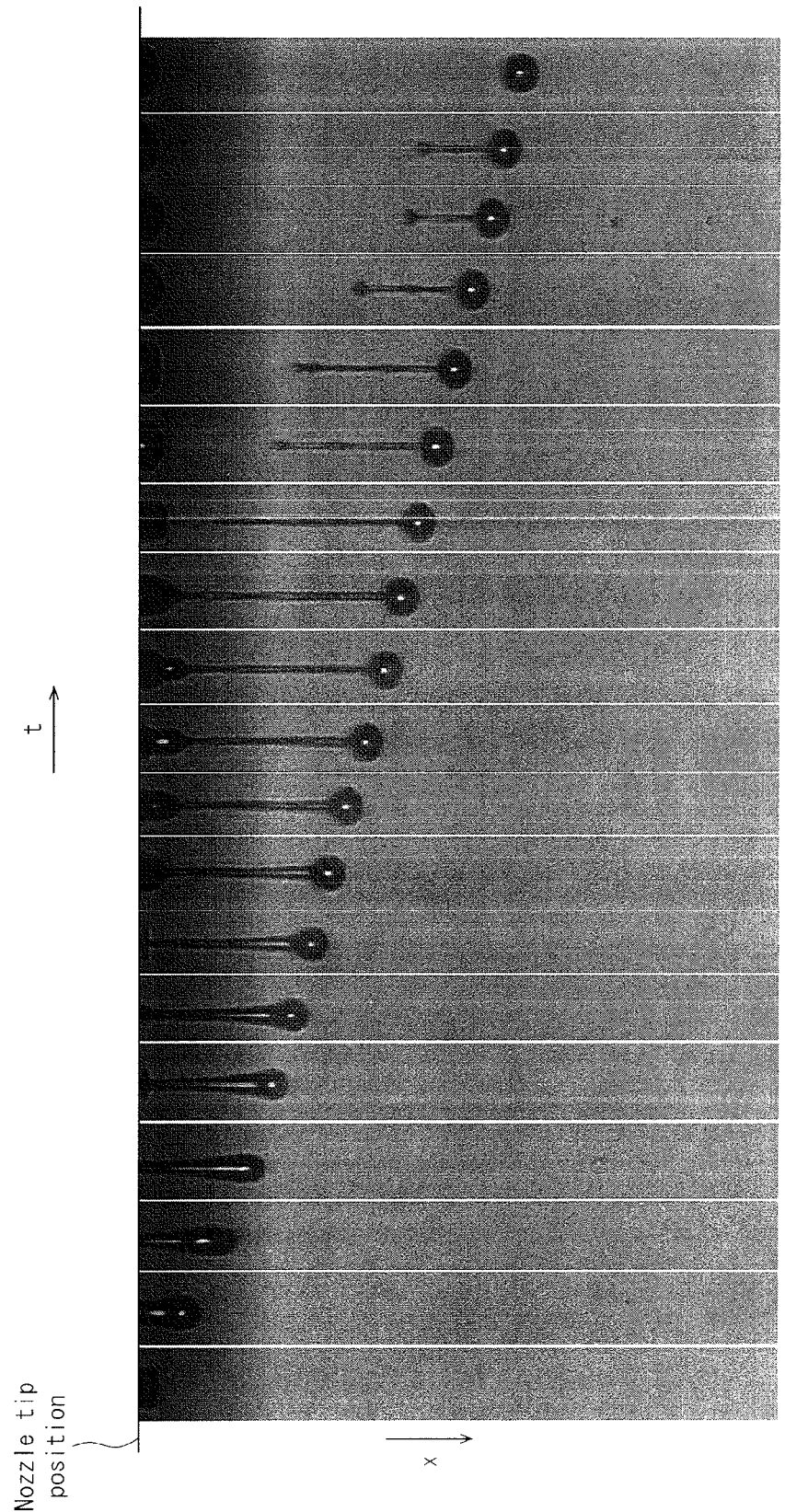
FIG. 7 illustrates on-site observation results of discharge behaviour by ink drops, from a validation experiment using the drive voltage signal pertaining to the Embodiment of the disclosure.
Figure 8:
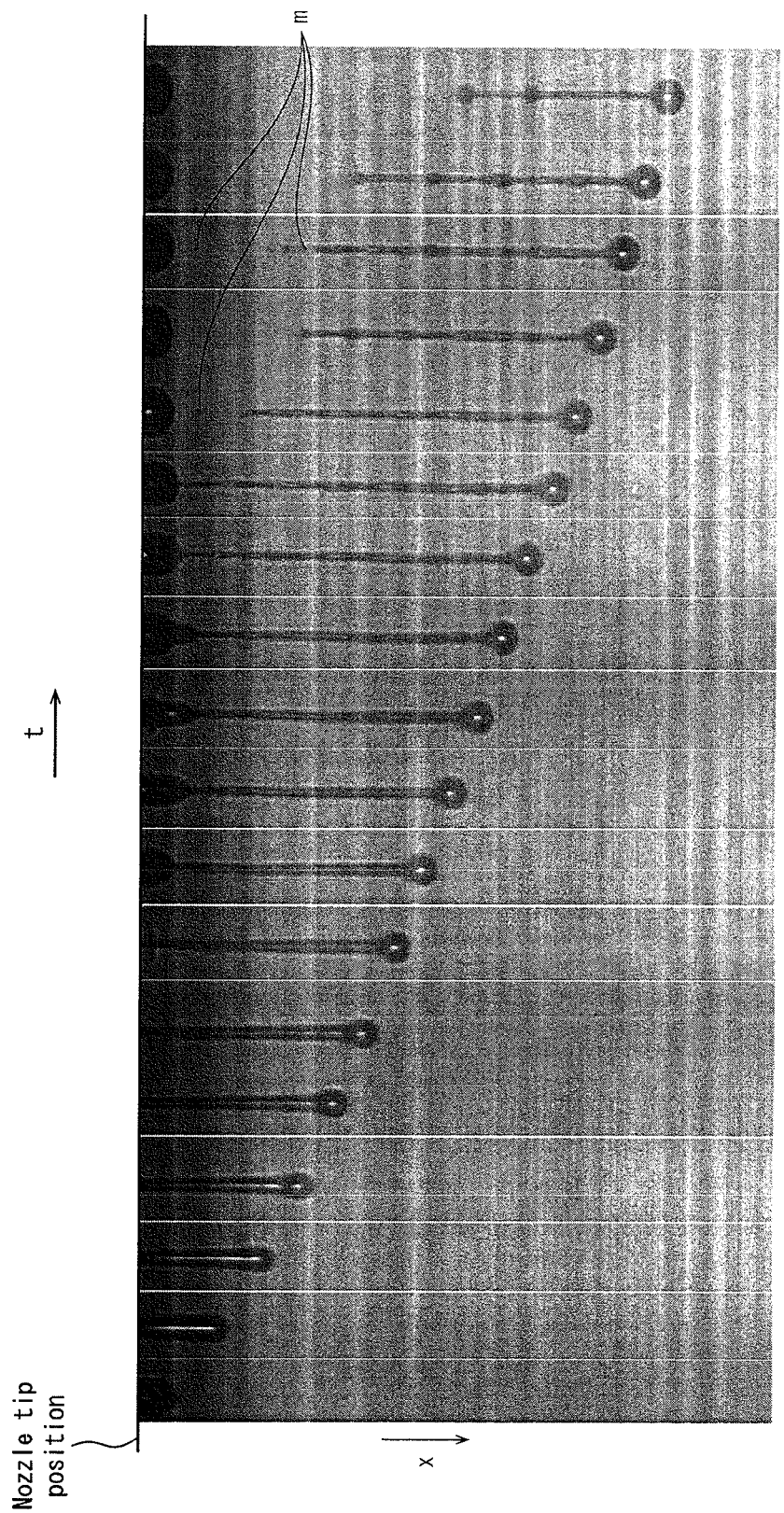
FIG. 8 illustrates on-site observation results of discharge behaviour by ink drops, from a validation experiment using a conventional drive voltage signal.

FIG. 7 illustrates results of on-site observation of ink drop discharge behaviour when the drive voltage signal pertaining to the present Embodiment is employed. FIG. 8 similarly illustrates results of on-site observation of ink drop discharge behaviour when a conventional drive voltage signal is employed. In FIGS. 7 and 8, the horizontal axis corresponds to time t and the vertical axis corresponds to drop distance x for the ink drops as measured from the tip position of the nozzles. The same scale is used in both drawings for time t and drop distance x.

The waveform configuration of the drive voltage signal used in the validation experiments is as shown in FIGS. 4A and 6 for the present Embodiment, and a similar configuration differing only in lacking the standby oscillatory waveform portion for the conventional model.

The ink reservoir of the inkjet head used in the validation experiments has nozzles with a diameter of 20 µm, the time T for causing the Helmholtz resonance in the ink reservoir is 3 µs, and the voltage maintenance interval X in the main oscillatory waveform portion is 2T. Also, drive voltage change A in the standby drive operation is set relative to drive voltage change B in the main oscillation such that A/B=20%. Likewise, drive voltage change C in the damping operation is set such that C/B=40%. Here, drive voltage change B is approximately 20 V. The drive voltage frequency is set to 1 kHz so as to avoid affecting the ink discharge repetition.

The ink used in the validation experiments uses F8-F6 as a solute (i.e., a copolymer combining F8 (polydioctylfluorene) and F6 (polydihexylfluorene)) and CHB (cyclohexylbenzene) as a solvent, where the solute has a weight-average molecular weight of 450 000 and the solvent has a density of 0.15 wt %. This ink has a relatively low viscosity of 4 mPa·s, and a surface tension of 34 mN/m.

The main drive operation was executed under the above-given conditions, thereby performing discharge of ink drops from the nozzles. The discharge behaviour was then observed on-site, using a high-speed camera for expanded imaging with an equipped microscope. The validation experiments were performed by discharging 30 drops of ink from 10 different nozzles (having identical diameters) for each experimental sample of ink, and the results were observed for reproducibility.

As shown in FIGS. 7 and 8, the discharge behaviour over time of the ink drops discharged from the ink interface is such that, as a main drop begins to descend, a ligament forms at a back side thereof. Then, as the ligament extends, a point is reached at which the ligament separates from the nozzle, or from the ink interface within the nozzle, and is thus discharged. Then, comparing the ink drops pertaining to the present Embodiment in FIG. 7 (hereinafter, validation ink drops) and the ink drops pertaining to a conventional model in FIG. 8 (hereinafter, comparative ink drops) reveals that in the present Embodiment, the main drop becomes rounded in the vicinity of the nozzle at an earlier time, and has a larger surface area. Also, the drop distance from the tip position of the nozzles for the validation ink drops is relatively shorter than the comparative ink drops, at all points on the drawings. That is, the validation ink drops indicate a lower initial speed at the tip position of the nozzles than is achieved by the comparative ink drops.

Further, the separation time of the ligament from the nozzles and the length of the ligament at separation is shorter in the validation ink drops than in the comparative ink drops. Also, for the comparative ink drops, a rear area of the ligament on the ink drop depicted two frames before the frame in which the most time has elapsed among the images of FIG. 8 has satellite mist m occurring due to Rayleigh instability, and the satellite mist in is also found scattered in the vicinity of the nozzle tip position. However, in the validation ink drops, no satellite mist occurs and the ligament is effectively absorbed into the main drop.

According the above, the drive voltage signal configuration of the present Embodiment enables the surface area to be increased by reducing the initial speed at which the ink drops are discharged. As a result, the ligament is reduced in length and the occurrence of satellite mist is seen to be constrained.

(Correlation Between Ligament Length and Voltage Maintenance Interval X)

The inventors performed validation experiments regarding changes in ligament length that accompany changes in the voltage maintenance interval X, in order to verify the correlation between ligament length and the voltage maintenance interval X in the main oscillatory waveform portion. The conditions for the validation experiment are the same as those for the above-described validation experiment (regarding the ligament length reduction effect), differing only in that the voltage maintenance interval X is being changed. The ligament length was measured through on-site observation of discharge behaviour in the ink drops.

Figure 9:
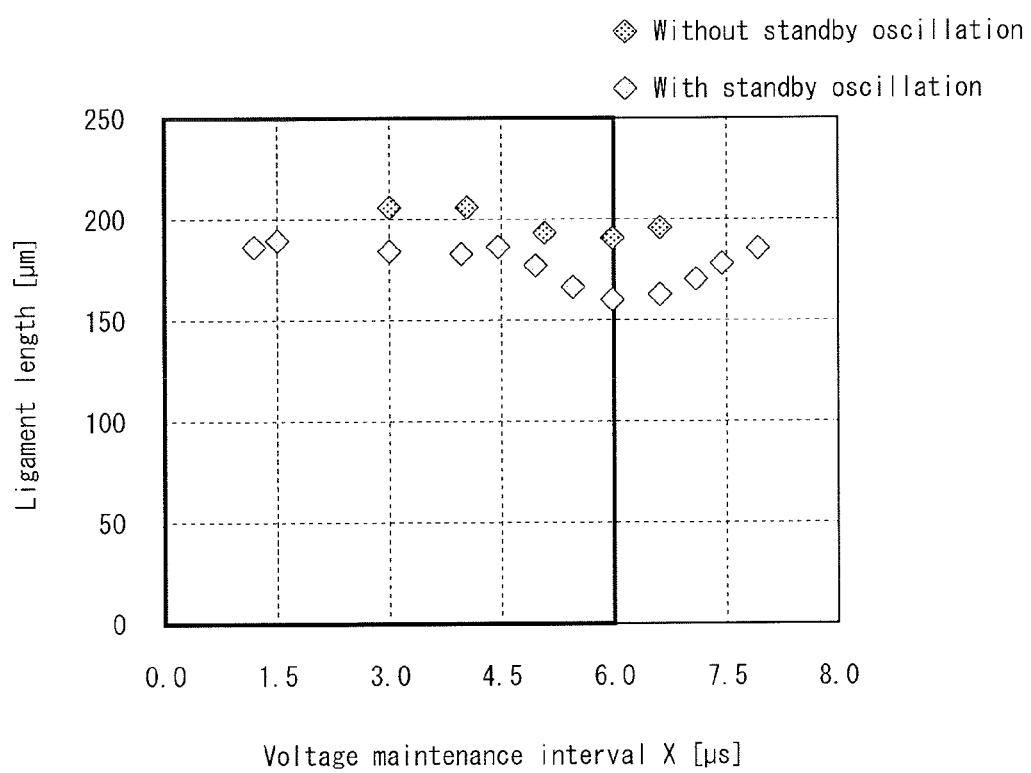
FIG. 9 is a graph indicating the correlation between pulse width in the main oscillatory waveform portion making up the drive voltage signal and ligament length in the ink drops.

The results of the validation experiment are given in FIG. 9. As FIG. 9 makes clear, when the drive voltage signal pertaining to the present Embodiment and including the standby oscillation is used, the ligament length reduction effect is observed when the voltage maintenance interval X is sit within a range of 4.5 µs to 7.5 µs. That is, setting the voltage maintenance interval X within a range of 1.5T to 2.5T produces the ligament length reduction effect. The reduction effect grows in intensity as the voltage maintenance interval X approaches 2T and is maximized when X is 2T. This appears to indicate that, during the period where oscillations in the ink interface during the standby oscillation are displaced toward the interior of the nozzles, executing the main drive operation when the displacement speed is greater allows for enhancement of the ligament reduction effect. This is thought to occur because, with respect to the displacement speed, the ligament reduction effect does not occur on an experimentally-observable scale when X is 1.5T, which is when the displacement speed begins to increase from zero toward the interior of the nozzle, and when X is 2.5T, which is when the displacement speed is decreasing toward zero, due to the very low displacement speed, although the displacement speed is not quite zero at these times.

Conversely, when a conventional drive voltage signal that lacks the standby oscillation, no change in ligament length is observed as the voltage maintenance interval X is varied.

According to the above, setting the voltage maintenance interval X in the main oscillatory waveform portion to a range of 1.5T to 2.5T was confirmed to effectively reduce the ligament length. In accordance with the validation experiment, setting the voltage maintenance interval X to a value greater than zero that satisfies $-0.5T+2nT \leq X \leq 0.5T+2nT$ (where n is a natural number including zero) enables the ligament length reduction effect.

(Discharge Speed Convergence in Ink Drops)

The inventers performed a validation experiment in order to verify the behaviour of the speed at which the ink drops are discharged over time reaches an average discharge speed. The conditions for the validation experiment are the same as those for the above-described validation experiment (regarding the ligament length reduction effect). Also, the distance between the leading position of the main drop and the tip position of the nozzle was measured by on-site observation of ink drop discharge behaviour, and the main drop speed was calculated based on the change in this distance over time. Here, the discharge behaviour of the ink drops being discharged is difficult to observe from outside when the drops are deeper inside the nozzles than the tip position. As such, for each of the ink drops, the leading position of the main drop is considered to be zero when aligned with the tip position of the nozzle, and this point is taken as time zero such that measurements proceed from taking the speed at this time as the initial speed.

Figure 10A:
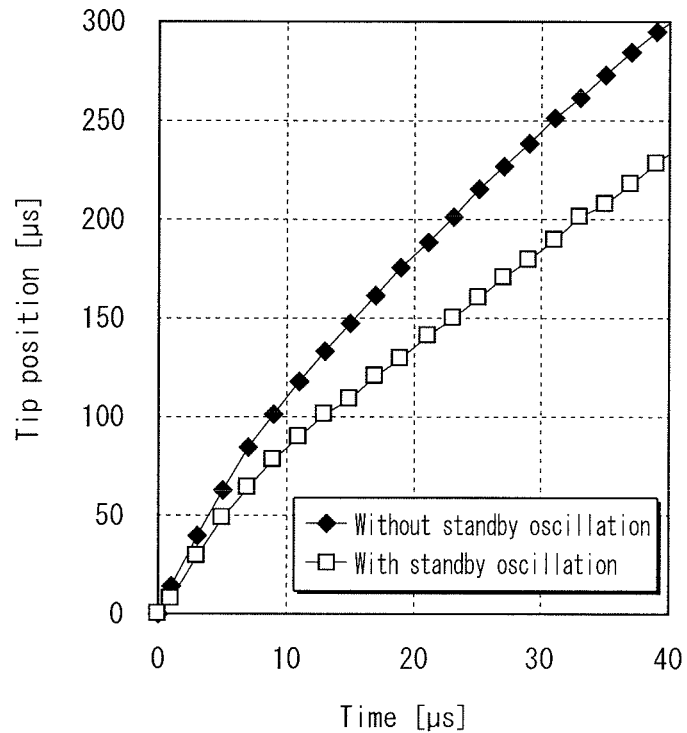
FIG. 10A is a graph of changes in tip position of the ink drops over time starting after the discharge of the ink drops.

The results of the validation experiment are given in FIG. 10. FIG. 10A indicates the change in leading position of the main drop over time for the discharged ink drops. As FIG. 10A makes clear, ink drops discharged using the drive voltage signal pertaining to the present Embodiment employing standby oscillation (also termed the validation ink drops) exhibit a smaller ratio of drop distance increase as measured for the leading position of the main drop, in comparison to ink drops discharged using a conventional drive voltage signal without the standby oscillation (also termed comparative ink drops). Then, based on the observed results of discharge behaviour given in FIGS. 7 and 8, the time at which the ligament separates from the ink interface is 20 µs for the validation ink drops and 22 µs for the comparative ink drops. That is, the ligament length of the validation ink drops is shown to be smaller than that of the comparative ink drops.

Figure 10B:
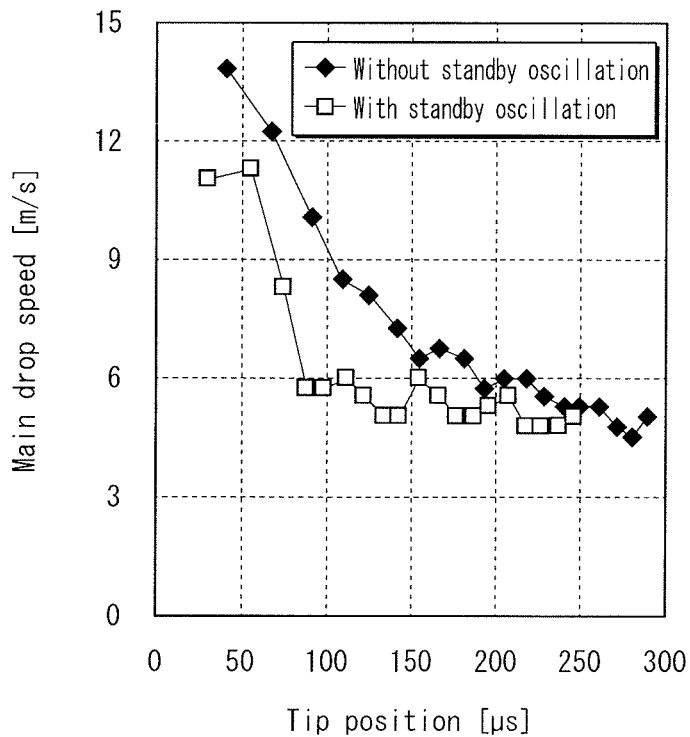
FIG. 10B is a graph of changes in speed of the ink drops relative to the changes in tip position of the ink drops over time.

FIG. 10B indicates the change in drop speed over time for the ink drops, as calculated from the results of FIG. 10A. Here, the horizontal axis represents the leading position of the drop, and differs from the horizontal axis that represents time only in terms of scale. Also, the initial speed of the main drops at the nozzle tip position is not calculated, as the main drop speed has been computed according to changes over time in the leading position of the main drop. As such, the initial speed is taken to be the speed when the leading position of the main drop is nearest to the leading position of the nozzle (i.e., 30 µm).

As shown in FIG. 10B, both the validation ink drops and the comparative ink drops start discharge at a respective discharge speed that decreases and converges to an order of 5 m/s. Also, the initial speed of the validation ink drops is slower than that of the comparative ink drops, such that less time is elapsed during the decrease in speed leading to conversion. Thus, according to the results shown in FIGS. 7, 8, and 10A, the validation ink drops have the ligament separate from nozzles when the leading position is at approximately 150 µm. In contrast, the comparative ink drops have the ligament separate from the nozzles when the leading position is at approximately 200 µm. The discharge speed at the time of separation is on the order of 5 m/s in both cases.

Accordingly, in comparison to the comparative ink drops, the verification ink drops have a lower initial speed, attenuation in speed constrains the size of the drops, and discharge speed is maintained similarly.

More specifically, the results of FIGS. 7 and 8 reveal that the surface area of the main drop for the validation ink drops is larger than for the comparative ink drops. Thus, for the validation ink drops, the effect of an increase in air resistance accompanying the increase in the surface area of the ink drops is more influential than the reduction in air resistance caused by the reduced speed of the ink drops, which suggests that the time elapsed until the discharge speed of the ink drops reaches the average discharge speed is reduced. In accordance with this suggestion, the ligament length is reduced in the validation ink drops due to the speed of ligament extension and the duration of ligament extension time both being reduced.

Also, when the same magnitude of drive voltage signal is applied to cause discharge of ink drops, reducing the time elapsed until the ink drop speed reaches the discharge speed and decreasing the ligament extension time of the ink drops still serves to reduce the time during which the ligament experiences tensile force from the ink interface. Accordingly, this suggests that the validation ink drops are constrained in terms of the magnitude of speed attenuation. As a result, and as seen in FIG. 10B, the validation ink drops maintain discharge speed on the same order as that of the comparative ink drops despite having a lower initial speed.

In conventional approaches, realising the same initial speed as the ink drops of the present Embodiment requires reducing the magnitude of the drive voltage signal used to cause the discharge of the ink drops, and thus produces a lower discharge speed in comparison to the ink drops of the present Embodiment.

As shown in FIG. 10B, the discharge speed of the validation ink drops is similar to that of the comparative ink drops. This indicates that the reduction in initial speed for the ink drops obtained using the drive voltage signal of the present Embodiment is achievable without changing the discharge speed, provided that the degree of this decrease in speed is within a fixed range.

Taking the speed at the time when the ink drop passes the tip of the nozzle to be the initial speed $V_0$ and the initial speed realised under the same conditions as the main drive operation but without the standby drive operation to be $V'_0$, then $V_0/V'_0$ is 75%, as calculated from the values in FIG. 10B. Thus, provided that $V_0/V'_0$ is at least 75%, then convergence at the optimal discharge speed is still possible despite the reduction in the initial speed at which the ink drops are discharged.

The range of optimal discharge speed is typically considered to be no less than 3 m/s and no more than 6 m/s, and the discharge speeds indicated in FIG. 10B are indeed within this range.

As for the lower bound of $V_0/V'_0$, an excessively small value may prevent the discharge speed from effectively achieving convergence at the optimal value, such as by having the discharge speed not fall within the optimal range even for the validation ink drops of FIG. 10B. For this reason, a lower bound of 50% is beneficial for $V_0/V'_0$.

Also, taking the above-described optimal discharge speed range as a given, then for the given range of values beneficial values are such that initial speed $V'_0$ is no less than 9 m/s and no more than 18 m/s, meaning that initial speed $V_0$ is then no less than 4.5 m/s and no more than 18 m/s.

(Optimal Range of Voltage Change for Standby Drive Operation)

In the above-described validation experiment, drive voltage change A used in the standby drive operation and drive voltage change B used in the main drive operation are set such that A/B=20%. Also, as shown in FIGS. 7, 9, 10A, and 10B, the ink drops obtained using the drive voltage signal of the present Embodiment effectively display a reduced initial speed. Thus, setting the upper bound for the value of A/B at no less than 20% enables effective resonance with a standby resonance oscillation to be produced by applying the standby oscillation to the ink interface so as to perform the standby drive operation.

[Embodiment 2]

First, the configuration of an organic electroluminescence device manufactured using the method pertaining to the present Embodiment is described, prior to explaining the manufacturing method for the organic electroluminescence device pertaining to the present Embodiment.

<Organic Electroluminescence Device Configuration>

Figure 11:
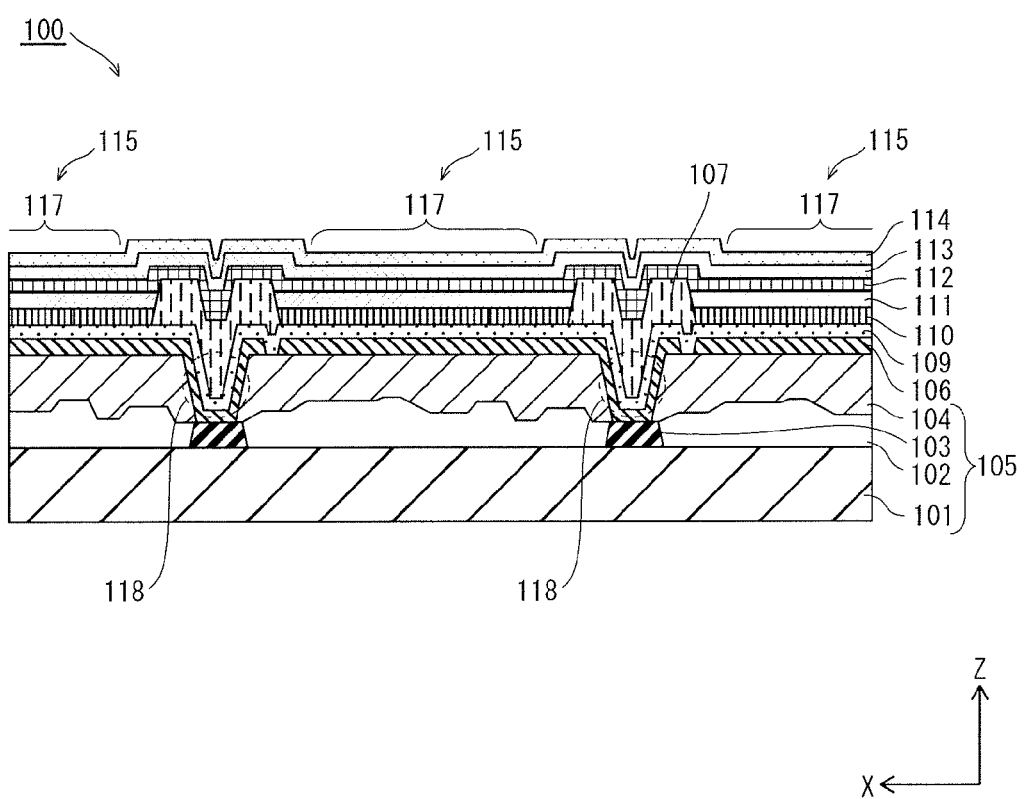
FIG. 11 is a partial cross-sectional diagram indicating the configuration of the organic electroluminescence device to which the manufacturing method of the Embodiment of the disclosure applies.

FIG. 11 is a partial cross-sectional diagram indicating the configuration of the organic electroluminescence device to which the manufacturing method of the present Embodiment applies. The organic electroluminescence device 100 of FIG. 11 is illustrated as an organic electroluminescence panel on which are disposed a plurality of organic electroluminescence elements 115. However, a single organic electroluminescence element may be provided alone on the organic electroluminescence device. The organic electroluminescence device 100 of FIG. 11 is intended only as an example.

In FIG. 11, the organic electroluminescence device 100 is oriented such that the top of the page is the display surface. That is, it is a top emission device.

As shown, a thin-film transistor (hereinafter, TFT) layer 102, a power supply electrode 103, and a planarization film 104 are sequentially layered on a substrate body 101. The substrate body 101, the TFT layer 102, the power supply electrode 103, and the planarization film 104 form a substrate 105. A pixel electrode 106 and a hole injection layer 109 are sequentially layered over the substrate 105. A partition layer 107 is layered over the hole injection layer 109, and has a plurality of apertures 117 formed therein, each serving as a formation region for a light-emitting layer 111. A hole transport layer 110 and a light-emitting layer 111 are sequentially layered in each of the apertures 117. Then, an electron transport layer 112, an electron injection layer 113, and a common electrode 114 are sequentially layered on the light-emitting layer 111 and the partition layer 107. In the present Embodiment, the hole injection layer 109, the hole transport layer 110, the light-emitting layer 111, the electron transport layer 112, and the electron injection layer 113 serve as functional layers. Also, the pixel electrode 106 serves as a first electrode and the common electrode 114 serves as a second electrode.

<Substrate>

The substrate body 101 is a background substrate for the organic electroluminescence device 100 having the TFT layer 102 formed on a front face thereof, the TFT layer 102 including a TFTs for driving the organic electroluminescence device 100 in an active matric configuration. The power supply electrode 103 is formed over the TFT layer 102 in order to supply electric power from the outside to each of the TFTs.

The planarization film 104 is provided in order to adjust surface gradations formed in providing the TFT layer 102 and the power supply electrode 103 for greater planarity, and is made of an organic material with excellent insulation properties.

The substrate body 101, the TFT layer 102, the power supply electrode 103, and the planarization film 104 form the substrate 105, which serves as the substrate of the present disclosure.

<Contact Holes>

A contact hole 118 is provided in order to electrically connect the power supply electrode 103 with the pixel electrode 106, and is formed across the planarization film 104 from front to back. The contact hole 118 is located between two of the aperture 117 with respect to a row in the Y-direction, and is covered by the partition layer 107. When the contact hole 118 is not covered by the partition layer 107, the presence of the contact hole 118 prevents the light-emitting layer 111 from being planar, which may lead to uneven light emission or similar problems. The above-described configuration avoids this issue.

<Pixel Electrode>

The pixel electrode 106 is an anode provided for the light-emitting layer 111 formed in each of the apertures 117. Given that the organic electroluminescence device 100 is a top-emission device, the material for the pixel electrode is selected for high reflectivity. The pixel electrode 106 serves as the first electrode of the disclosure.

<Hole Injection Layer>

The hole injection layer 109 is provided in order to promote the injection of holes from the pixel electrode 106 into the light-emitting layer 111.

<Partition Layer>

The partition layer 107 serves to prevent inks from mixing during the formation of the light-emitting layer 111, as inks for red (R), green (G), and blue (B) each include a solvent and different corresponding light-emitting layer materials.

The partition layer 107 provided so as to cover the contact hole 118 has a trapezoidal cross-section and extends across the entirety of the X-Z plane or the Y-Z plane.

Figure 12:
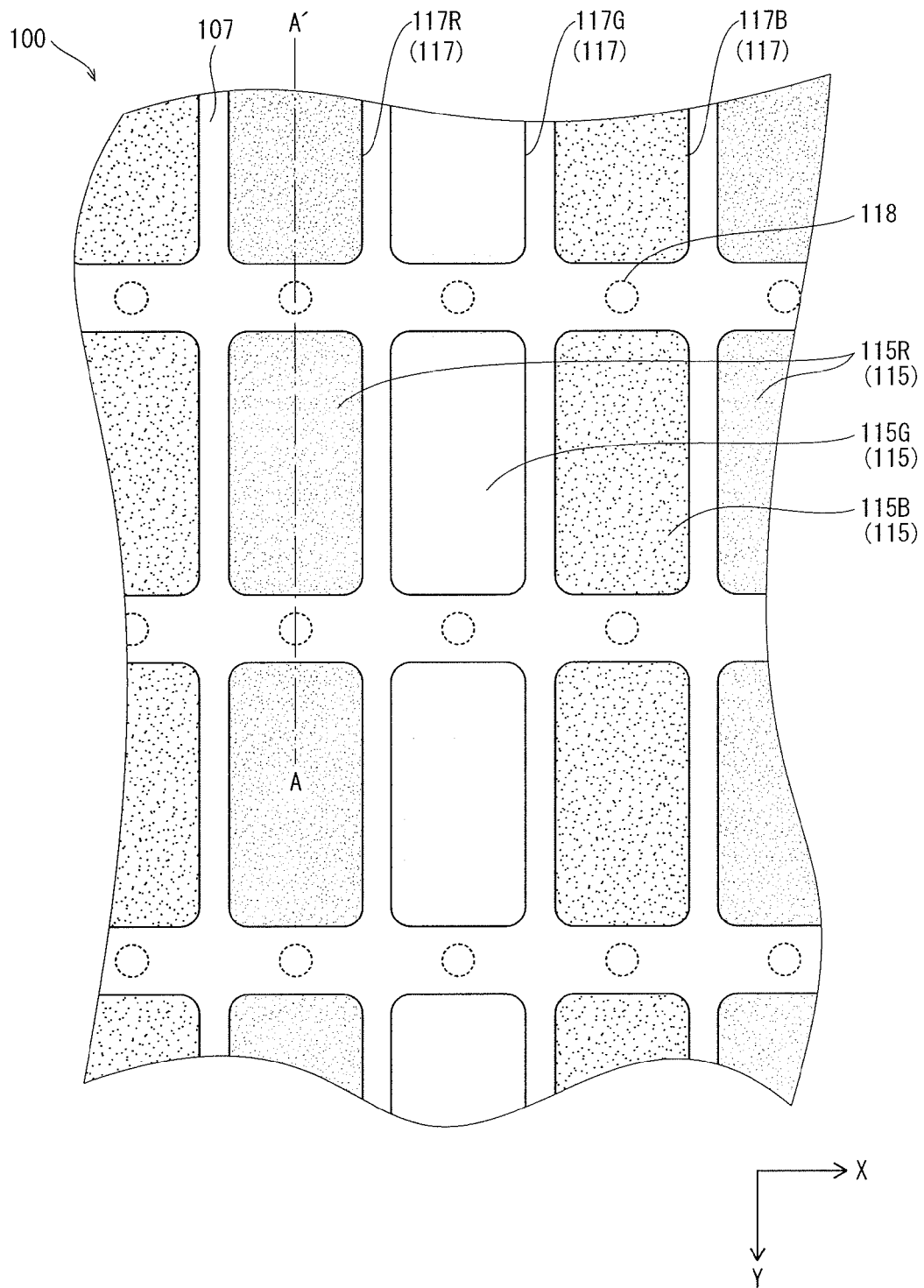
FIG. 12 is a schematic diagram illustrating the shape of a partition layer in an organic electroluminescence display panel serving as the organic electroluminescence device shown in FIG. 11.

FIG. 12 is a schematic diagram of the partition layer 107 as seen from the front face of the organic electroluminescence display panel of the organic electroluminescence device 100. For simplicity of explanation, the hole transport layer 110, the light-emitting layer 111, the electron transport layer 112, the electron injection layer 113, and the common electrode 114 have been omitted. The partial cross-section of FIG. 11 is taken along line A-A' of FIG. 12.

As shown in FIG. 12, the organic electroluminescence device 100 includes a red organic electroluminescence element 115R, a green organic electroluminescence element 115G, and a blue organic electroluminescence element 115B, each provided in plurality and along in the X-Y directions (i.e., in a matrix). The organic electroluminescence elements 115R, 115G, and 115B are sub-pixels, where each pixel is formed by a group of three such sub-pixels.

The apertures 117 in the partition layer 107 are provided in plurality along the X-Y directions, in correspondence with the organic electroluminescence elements 115R, 115G, and 115B. The apertures 117 are the region of formation for the light-emitting layer 111, and serve to device the arrangement and shape of the light-emitting layer 111. Each aperture 117 has a rectangular shape oriented lengthwise along the Y-axis, with dimensions of for example, 30 μm to 130 μm in the X-direction (i.e., the row direction) and 150 μm to 600 μm in the Y-direction (i.e., the column direction).

Each aperture 117 includes further apertures 117R, 117G, 117B, each corresponding to one of the colours R, G, and B. The light-emitting layer 111 is formed correspondingly in red for aperture 117R, in green for aperture 117G, and in blue for aperture 117B. That is, aperture 117R is formed in organic electroluminescence element 115R, aperture 117G is formed in organic electroluminescence element 115G, and aperture 117B is formed in organic electroluminescence element 115B. Also, the apertures 117 are arranged in columns for each colour red, green, and blue, such that each column includes apertures corresponding to the same colour.

The contact hole 118 is arranged between Y-direction columns of the aperture 117, or in other words, below the partition layer 107. Although the pixel electrode 106 is described above as being formed in correspondence with each of the light-emitting layers 11 formed in the apertures 117, this actually signifies that the pixel electrode 106 is provided for each of the sub-pixels.

<Hole Transport Layer>

The explanation now returns to the partial cross-section of FIG. 11. The hole transport layer 110 serves to transport holes injected from the pixel electrode 106 to the light-emitting layer 111.

<Light-Emitting Layer>

The light-emitting layer 111 is a component performing light emission through recombination of carriers, that includes light-emitting layer material corresponding to each colour red, green, and blue. Here, aperture 117R is made of a red light-emitting layer material, aperture 117G is made of a green light-emitting layer material, and aperture 117B is made of a blue light-emitting layer.

<Electron Transport Layer>

The electron transport layer 112 serve to transport electrons injected from the common electrode 114 to the light-emitting layer 111.

<Electron Injection Layer>

The electron injection layer 113 promotes injection of electrons from the common electrode 114 into the light-emitting layer 111.

<Common Electrode>

The common electrode 114 is a cathode that serves as the second electrode of the present disclosure. The organic electroluminescence device 100 being a top-emission device, the material for the common electrode 114 is selected to be optically transmissive.

<Other>

Although not indicated in FIG. 11, a sealing layer is provided at the top of the common electrode 114 in order to constrain degradation of the light-emitting layer 111 due to contact with water or the atmosphere. The organic electroluminescence device 100 being a top-emission device, the material for the sealing layer is selected to be optically transmissive, such as silicon nitride (SiN) or silicon oxynitride (SiON).

Also, a layer of indium tin oxide (ITO) or indium zinc oxide (IZO) may be provided between the pixel electrode 106 and the hole injection layer 109 in order to improve the connection between layers. Further, the light-emitting layer 111 formed in each of the apertures 117 may be an organic light-emitting layer for each colour.

<Materials>

The materials used for each of the layers are described next. Needless to say, materials other than the following may also be used for each of the layers.

Substrate body 101: an insulating material such as a non-alkali glass, a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, aluminium oxide, and so on.

Planarization film 104: a polyimide resin or an acrylic resin.

Pixel electrode 106: silver (Ag), aluminium (Al), an alloy of silver, palladium, and copper, an alloy of silver, rubidium, and gold, an alloy of molybdenum and chromium (MoCr), an alloy of nickel and chromium (NiCr).

Partition layer 107: an acrylic resin, a polyimide resin, a novolac-type phenol resin.

Hole injection layer 109: a metal oxide, metal nitride, or metal oxynitride such as molybdenum oxide (MoOx), tungsten oxide (WoOx), or molybdenum-tungsten oxide (MoxWyOz).

Hole transport layer 110: a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative (as listed in Japanese Patent Application No. H5-163488).

Light-emitting layer 111: F8-F6 (a copolymer combining F8 (polydioctylfluorene) and F6 (polydihexylfluorene)), an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex (as listed in Japanese Patent Application No. H5-163488).

Electron transport layer 112: barium, phtalocyanine, lithium fluoride.

Electron injection layer 113: a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, or a quinolone complex derivative (as listed in Japanese Patent Application Publication No. H5-163488).

Common electrode 114: ITO, IZO

<Manufacturing Method for Organic Electroluminescence Device>

First, an overall example is given of a manufacturing method for the organic electroluminescence device 100, which is an organic electroluminescence display panel. Then, the details of the application process are given, as part of functional layer formation within the manufacturing method.

<Overview>

Figure 13A:
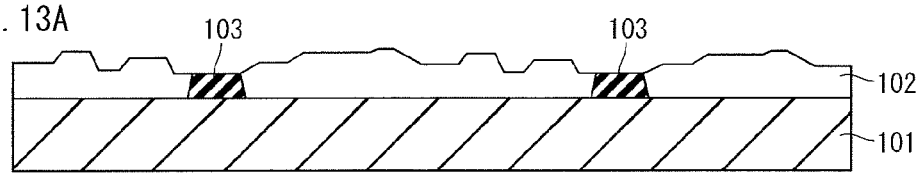
FIGS. 13A-13E are schematic cross-sections indicating parts of a manufacturing process in the organic electroluminescence device manufacturing method pertaining to an Embodiment of the disclosure.

The substrate body 101 is prepared with the TFT layer 102 and the power supply electrode 103 formed thereon (see FIG. 13A).

Figure 13B:
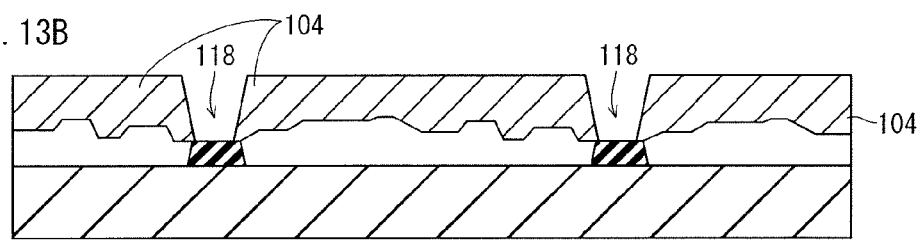

Afterward, a photo-resist method is used to form the planarization film 104 over the TFT layer 102 and the power supply electrode 103 to a thickness of approximately 4 μm, using an organic material having excellent insulation properties. Here, the contact hole 118 is formed at a position between a pair of neighbouring apertures 117 with respect to the Y-dimension (see FIG. 13B). Applying the photo-resist method with desired parameters enables the planarization film 104 and the contact hole 118 to be formed simultaneously. Of course, no limitation is intended to this formation method for the contact hole 118. For example, after unitary formation of the planarization film 104, a specific portion of the planarization film 104 may be removed to form the contact hole 118. These manufacturing steps serve to form the substrate 105.

Subsequently, a vacuum deposition or sputtering method is used to form the sub-pixels over the substrate 105, while connecting the power supply electrode 103 to the pixel electrode 106, which is made of metal to a thickness of 150 nm. The formation of the pixel electrode on the substrate 105 corresponds to the formation of the first electrode of the disclosure.

Figure 13C:
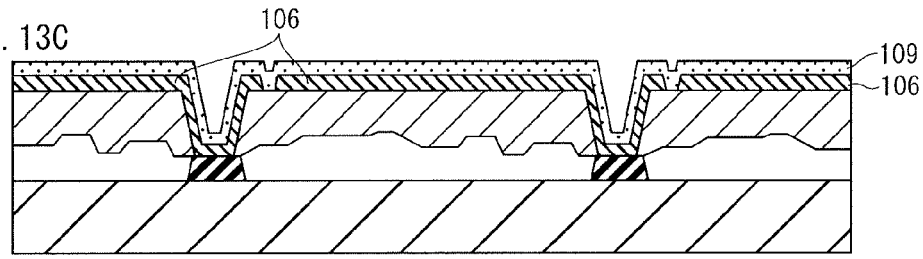

Next, a reactive sputtering method is used to form the hole injection layer 109 (see FIG. 13C).

Figure 13D:
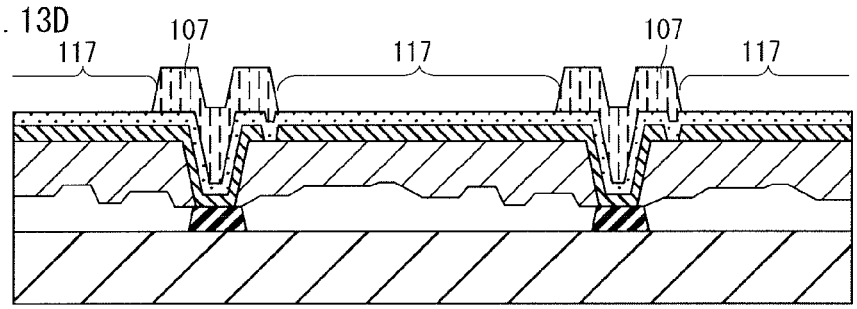

A photo-lithography method is then used to form the partition layer 107. First, a partition layer material is prepared, which is a paste that includes a photosensitive resist. The partition layer material is applied uniformly over the hole injection layer 109. A mask formed in the pattern of the apertures 117, as shown in FIG. 11, is overlaid thereon. The top of the mask is then irradiated with light to form a partition layer pattern. Afterward, an aqueous or non-aqueous etching liquid (i.e., developing fluid) is used to wash away the excess partition layer material. The patterning of the partition layer material is thus completed. This defines the apertures 117 that will serve as formation regions for the light-emitting layer, and completes the partition layer 107 with water repellency at least on a front surface thereof (see FIG. 13D).

In the formation of the partition layer 107, plasma processing may also be applied by adjusting the contact angle of the partition layer 107 relative to the ink for the organic light-emitting layer and the ink for the hole transport layer, which are later applied in the aperture 117, or by applying a surface process to the surface of the partition layer 107 with a predetermined alkali solvent, water, or organic solvent in order to impart water repellency to the surface.

Figure 13E:
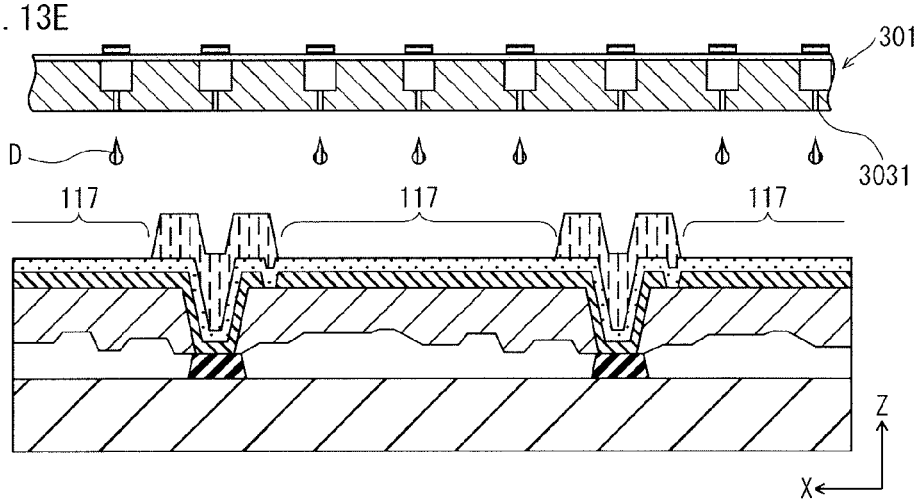
Figure 14A:
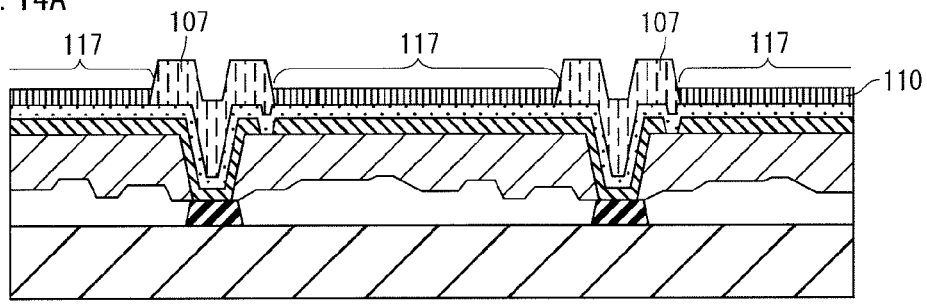
FIGS. 14A-14D are schematic cross-sections indicating parts of a manufacturing process in the organic electroluminescence device manufacturing method pertaining to an Embodiment of the disclosure.

Next, an organic material for the hole transport layer 110 is mixed with a solvent at a predetermined ratio to prepare the ink for the hole transport layer. The ink is supplied to each inkjet head 301 and then discharged in a discharge step from the respective nozzles 3031 corresponding to each of the apertures 117 (see FIGS. 3A and 3B) producing drops D of the ink for the hole transport layer (see FIG. 13E). Afterward, the solvent in the ink evaporates and dries, with heating applied if necessary, to form the hole transport layer 110 (see FIG. 14A).

Figure 14B:
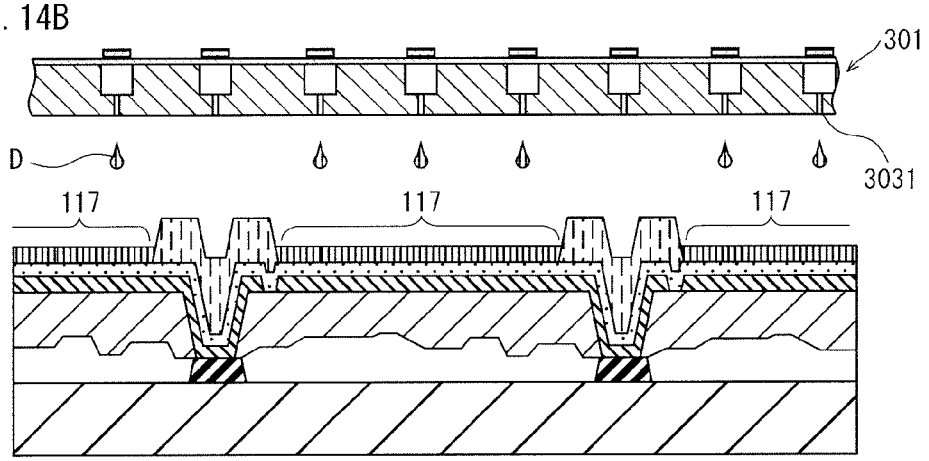
Figure 14C:
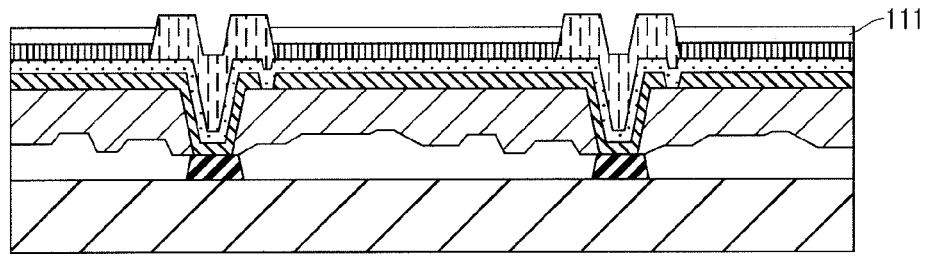

Next, an organic material for the light-emitting layer 111 is mixed with a solvent at a predetermined ratio to prepare the ink for the light-emitting layer. The ink is supplied to the inkjet head 301 and then discharged in a discharge step from the respective nozzles 3031 corresponding to each of the apertures 117, producing drops D of organic light-emitting layer ink (see FIG. 14B). Afterward, the solvent in the ink evaporates and dries, with heating applied if necessary, to form the light-emitting layer 111 (see FIG. 14C).

Next, a film of material for the electron transport layer 112 is formed through vacuum deposition on the surface of the light-emitting layer 111. This forms the electron transport layer 112. Next, a material for the electron injection layer 113 is applied using a deposition method, a spin coat method, a casting method or similar, thus forming the electron injection layer 113. The formation of the hole injection layer 109, the hole transport layer 110, the light-emitting layer 111, the electron transport layer 112, and the electron injection layer 113 described so far corresponds to the functional layer formation of the present disclosure.

Figure 14D:
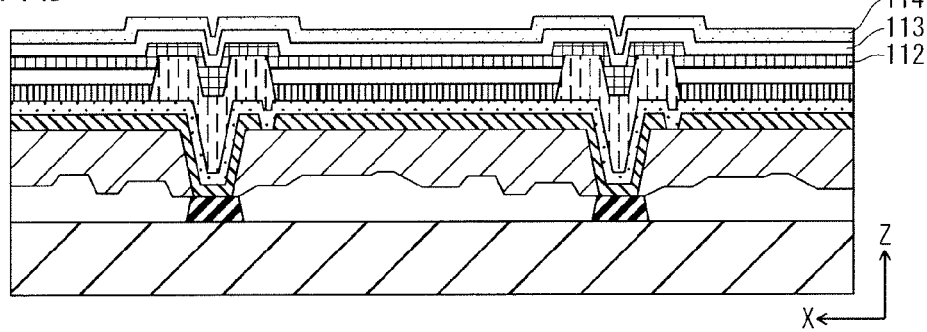

Next, a vacuum deposition method, a sputtering method, or similar is used to form a film of material for the common electrode 114 over the surface of the electron injection layer 113. The common electrode 114 is thus formed (FIG. 14D). The formation of the common electrode 114 corresponds to the formation of the second electrode of the disclosure.

Although not diagrammed, a sealing layer may be formed on the surface of the common electrode 114 by applying a film of SiN, SiON, or similar optically transmissive material using a sputtering method, a CVD method, or similar.

The organic electroluminescence device 100 is thus completed by performing the above-described process.

<Application Process>

As described above, the hole transport layer 110 and the light-emitting layer 111 are respectively formed by preparing and applying inks that combine the material for each layer with a solvent, such that the layer is formed upon evaporation and drying of the solvent with heat applied if necessary. The following describes the details of application in the formation process with particular attention to the light-emitting layer 111.

(Inkjet Device)

The application is performed using the inkjet device pertaining to the present disclosure and described in Embodiment 1. The configuration of the inkjet device is as described above with reference to FIGS. 1, 2, 3A, and 3B. In the present Embodiment, using the inkjet device 1000 for application using the inkjet method involves providing a plurality of heads 30 (not diagrammed) on the inkjet device 1000 and preparing a plurality of inkjet heads 301 for each of these heads 30 in correspondence with different inks used by the heads 30. Here, an example is described in which the length direction of the elongated apertures 117 is disposed so as to intersect a scanning direction (i.e., the Y row direction) of the heads 30 (or the inkjet heads 301) at a predetermined angle.

(Positional Relationship of Heads and Apertures Subject to Application Process)

Figure 15:
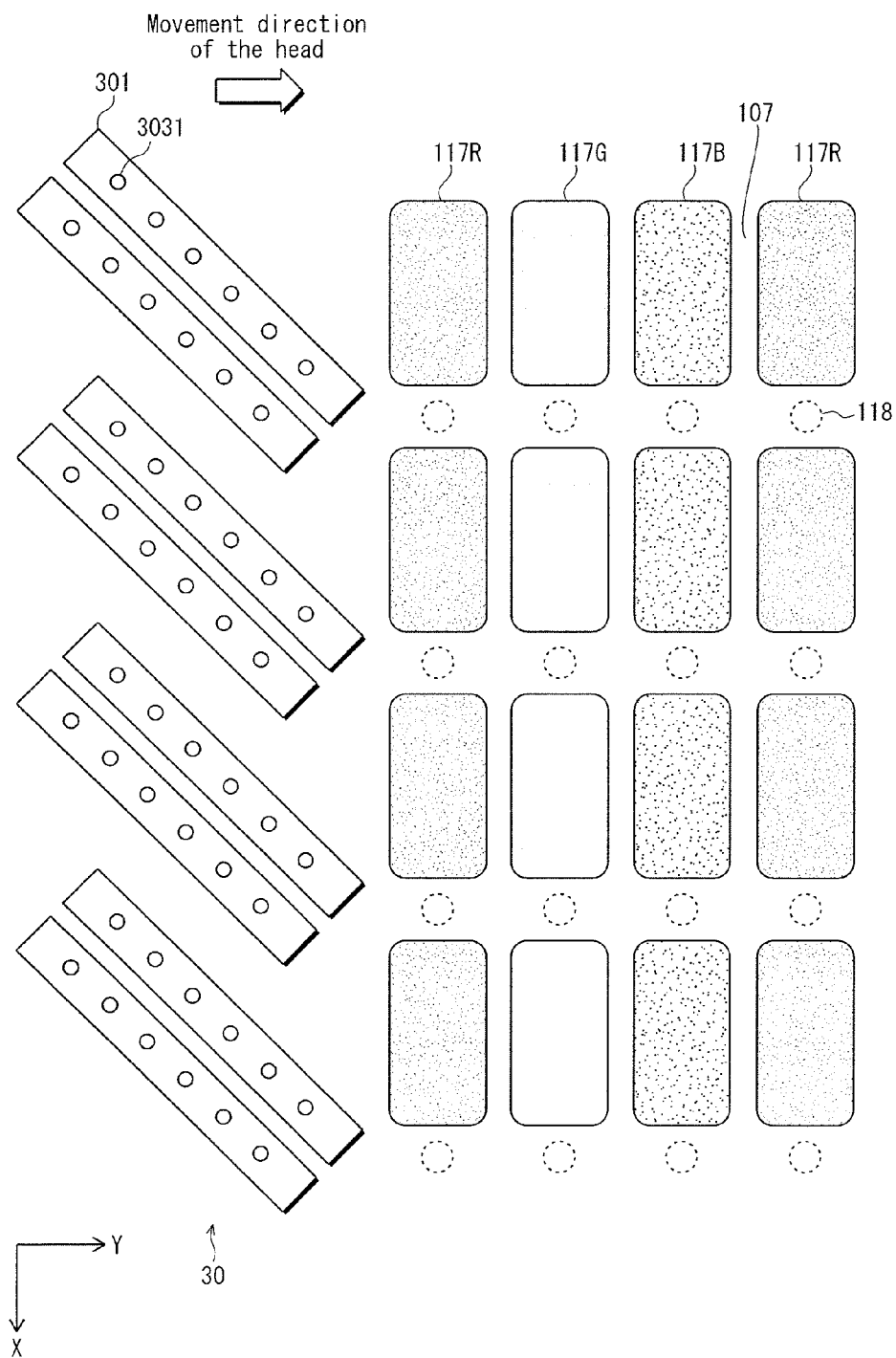
FIG. 15 illustrates the positional relationship between the inkjet head and a substrate subject to application during a manufacturing step of the organic electroluminescence device manufacturing process pertaining to an Embodiment of the disclosure.

FIG. 15 illustrates the positional relationship between a substrate subject to application and the heads 30 in the organic EL display panel manufacturing process.

In FIG. 15, the substrate subject to application is disposed to the right-hand side of the head 30 on the page. This illustrates the substrate in a state prior to the application step, i.e., a state in which a plurality of apertures 117 are disposed in a matrix as pixel units and the partition layer 107 has been formed. The inkjet head 301 is provided in plurality, such that the nozzles 3031 discharge the ink at a predetermined pitch with respect to the column (X) direction. At this point, the application pitch of the nozzles 3031 is adjustable by changing the oblique longitudinal angle of the inkjet heads 301.

As shown in FIG. 15, the present Embodiment has six of the nozzles 3031 arranged along the longitudinal direction of each inkjet head 301, such that five of these nozzles 3031 correspond to a given one of the apertures 117 (i.e., 117R, 117G, and 117B). The heads 30 of the inkjet device in FIG. 15 each correspond to one of the apertures 117 (i.e., 117R, 117G, and 117B), and although not shown, similarly-shaped heads 30 each correspond to two of the remaining apertures 117. That is, a plurality of inkjet heads each storing an ink corresponding to one of the colours (red, green, and blue) emitted by the light-emitting layer are provided in the head that in turn includes a plurality of inkjet heads.

During application, the nozzles corresponding to each of the apertures 117 discharge drops of a defined ink into the corresponding aperture 117 while the inkjet head 301 scans along the row (Y) direction. The above-described process is then performed to form the light-emitting layer 111. Here, the volume of the discharged drops must be even across neighbouring apertures 117.

The hole transport layer 110 is formed through a similar application process to the light-emitting layer 111, performed using a different type of ink than used for the light-emitting layer 111. Thus, as shown in FIG. 15, the application process is performed by discharging ink drops from a plurality of inkjet heads 301 storing the same type of ink while the head 30 performs scanning.

(Drive Voltage Signal)

The material for the light-emitting layer 111 corresponds to one of the colours (red, green, and blue) emitted thereby. As such, the application process for the light-emitting layer 111 is performed in correspondence with each of the colours, using an inkjet head 301 containing ink corresponding to each colour to perform scanning and application.

Of course, the ink material varies for each of the colours of light emitted. For example, when the ink corresponding to red light has relatively low viscosity, and thus has a long ligament relative to the inks corresponding to the other colours, which leads to worsened landing accuracy due to satellite mist, then the drive voltage signal of the present disclosure (e.g., see FIG. 4A) is used as drive voltage signal applied to the voltage elements of the inkjet head 301 containing the ink corresponding to red light while a conventional drive voltage signal that does not include the standby oscillatory waveform portion is used for the inkjet head 301 that contains ink corresponding to other colours. Naturally, the drive voltage signal of the present disclosure may also be used for all inkjet heads 301, and the drive voltage signal of the present disclosure may be applied to only a selected subset of the nozzles 3031 on a single inkjet head 301.

As for the application and formation of the hole transport layer 110, the drive voltage signal of the present disclosure may be applied according to ink properties, much like the light-emitting layer 111.

Also, in the present Embodiment, the application process for the hole transport layer and for the light-emitting layer corresponding to each colour of light emitted involves applying the same drive voltage signal to each inkjet head from start to finish. However, no such limitation is intended. For example, when the ligament length of discharged ink increases after a certain time has elapsed since the start of application, then the standby drive operation may be performed at that time. Also, the drive voltage signal applied to the voltage elements may have a waveform configuration that includes the standby oscillatory waveform portion and the main oscillatory waveform portion (e.g., see FIG. 4A), such that the drive voltage signal of the present disclosure is applied over a fixed time from start to end of the application process.

<Other>

The inkjet device and the organic electroluminescence device manufacturing method of the present Embodiment are described above using specific examples. However, no particular limitation is intended to the Embodiment, which is intended only as a specific example for easily illustrating the configuration, use, and effects of the disclosure.

The inkjet device may be configured to have only one inkjet head, or may have a plurality of inkjet heads. The inkjet device configured to have a plurality of inkjet heads may, for example, include the head 30 in plurality, be provided with a gantry 210 and a carriage 220 corresponding to each of the heads 30, and be connected to the control device 15. Also, the nozzles may be provided in plurality for a single inkjet head, or as shown in region F of FIG. 3B, one inkjet head may have a single nozzle corresponding to a single voltage element.

The drive voltage signal of the present disclosure is applied to at least one inkjet head among a plurality of inkjet heads and at least one nozzle among a plurality of nozzles on the inkjet head, and either a conventional drive voltage signal or the drive voltage signal of the present disclosure may be applied to the remaining inkjet heads and nozzles.

The pressure applier serving to cause discharge of ink through application of pressure to the ink reservoir is not limited to the piezoelectric scheme that includes a voltage element as described in the Embodiment. A thermal scheme, a pump scheme, or some other approach to causing discharge of ink by applying a main oscillation having wavelike qualities to the ink interface may also be used. For instance, when a thermal scheme is used, pressure is applied by evaporating ink and producing bubbles in the ink reservoir. In such a case, the pressure applier may be applied to the heater. Also, the present Embodiment uses flexible vibration elements in the piezoelectric scheme. However, the pressure applier may also use vertical vibration elements or similar. Further, the pressure applier need not only include the voltage element as piezoelectric elements. A pressure applier that includes a vibration plate layered over the piezoelectric elements may also be used.

In the present Embodiment, the organic electroluminescence device is described as top-emission device. Thus, the cathode is made of ITO or IZO, which are optically transmissive conductive materials. However, no such limitation is intended to the organic electroluminescence device of the present disclosure. A bottom-emission configuration is also possible, in which case a metallic material such as aluminium may be used for the cathode. Also, the functional layer is not limited to including the hole injection layer, the hole transport layer, the light-emitting layer, the electron transport layer, and the electron injection layer. Any configuration including at least the light-emitting layer formed through application is possible.

The present Embodiment describes the organic electroluminescence device manufactured by the organic electroluminescence device manufacturing method as being an organic electroluminescence display panel. However, no such limitation to the organic electroluminescence device is intended. Any organic electroluminescence device may apply, such as a simple organic electroluminescence element.

INDUSTRIAL APPLICABILITY

The inkjet device of the present disclosure enables effective constraint of the satellite mist effect, and is applicable to an application process for an organic film in an organic imaging element or an organic electroluminescence element, and most beneficially to an application process for devices such as large-size substrates for organic electroluminescence panels.

REFERENCE SIGNS LIST

15 Control device
30 Head
40 Ink
61 Standby oscillatory waveform portion
62 Main oscillatory waveform portion 63 Damping oscillatory waveform portion
100 Organic electroluminescence device
101 Substrate body
102 TFT layer
103 Power supply electrode
105 Substrate
106 Pixel electrode
109 Hole injection layer
110 Hole transport layer
111 Light-emitting layer
112 Electron transport layer
113 Electron injection layer
114 Common electrode
115 Organic electroluminescence element
213 Controller
300 Discharge controller
301 Inkjet head
301e Ink reservoir
301h Vibration plate
1000 Inkjet device
3010 Pressure applier
3031 Nozzle

The invention claimed is:

1. An inkjet device, comprising:
an inkjet head having an ink reservoir storing an ink, a pressure applier applying pressure to the ink in the ink reservoir, and a nozzle discharging the ink from the ink reservoir as an ink drop; and
a discharge controller controlling pressure application by the pressure applier, wherein
the pressure applier executes the pressure application to perform:
  a standby drive operation of applying a standby oscillation to the ink, an amplitude direction matching a discharge direction within a range that does not cause the ink to be discharged from the nozzle; and
  a main drive operation of applying a main oscillation to the ink, the amplitude direction matching the discharge direction within a range that causes the ink to be discharged from the nozzle, and the main drive operation being performed after the standby drive operation,
the main drive operation is performed during a resonance state occurring after the standby drive operation and after application of a resonance oscillation causing resonance in the standby oscillation,
a start time of the main drive operation occurs within a time interval where a displacement by the standby drive operation is oriented toward an interior of the nozzle,
the pressure applier includes a piezoelectric element,
the discharge controller controls the pressure application by the pressure applier by controlling a voltage signal applied to the piezoelectric element,
a waveform of the voltage signal includes a standby oscillatory waveform portion for executing the standby drive operation, and a main oscillatory waveform portion for executing the main drive operation,
the main oscillatory waveform portion includes a first period of changing voltage to apply the resonance oscillation, and a second period of changing voltage to apply the main oscillation, and
a time interval X between the first period and the second period is set using a time T required for Helmholtz resonance, and satisfies $-0.5T+2nT \leq X \leq 0.5T+2nT$ (where $n$ is a natural number including zero) with a value that is greater than zero.

2. The inkjet device of claim 1, wherein
a voltage change A of the voltage signal when applied to the piezoelectric element causing the standby oscillation of the ink during the standby drive operation is set proportionately to a voltage change B of the voltage signal when applied to the piezoelectric element causing the main oscillation of the ink during the main drive operation, and satisfies $0\% < A/B \leq 20\%$.

3. The inkjet device of claim 1, wherein
for a discharge speed of the ink being discharged from the nozzle by the main drive operation,
an initial speed $V_0$, defined as a speed of the ink passing a tip of the nozzle, and an initial speed $V_0'$, defined as the speed of the ink under identical conditions except that the standby drive operation is not executed, satisfy $50\% \leq V_0/V_0' < 100\%$.

4. A manufacturing method for an organic electroluminescence device, comprising:
forming a first electrode over a substrate;
forming a functional layer that includes a light-emitting layer over the first electrode; and
forming a second electrode over the functional layer, wherein
at least for the light-emitting layer, the forming of the functional layer involves applying an ink that includes a formation material and a solvent and then drying the ink by causing the solvent to evaporate, and
the ink is applied using the inkjet device of claim 1.

* * * * *